(12) United States Patent
Jo

(10) Patent No.: US 9,196,831 B2
(45) Date of Patent: Nov. 24, 2015

(54) TWO-TERMINAL MEMORY WITH INTRINSIC RECTIFYING CHARACTERISTIC

(71) Applicant: Crossbar, Inc., Santa Clara, CA (US)

(72) Inventor: Sung Hyun Jo, Sunnyvale, CA (US)

(73) Assignee: Crossbar, Inc., Santa Clara, CA (US)

( * ) Notice: Subject to any disclaimer, the term of this patent is extended or adjusted under 35 U.S.C. 154(b) by 0 days.

(21) Appl. No.: 14/108,160

(22) Filed: Dec. 16, 2013

(65) Prior Publication Data

US 2014/0269002 A1 Sep. 18, 2014

Related U.S. Application Data

(60) Provisional application No. 61/785,938, filed on Mar. 14, 2013.

(51) Int. Cl.
*H01L 45/00* (2006.01)
*G11C 13/00* (2006.01)
*H01L 27/24* (2006.01)

(52) U.S. Cl.
CPC ........ *H01L 45/1608* (2013.01); *G11C 13/0011* (2013.01); *H01L 27/2418* (2013.01); *H01L 45/085* (2013.01); *H01L 45/12* (2013.01); *H01L 45/1233* (2013.01); *H01L 45/1266* (2013.01); *H01L 45/145* (2013.01); *H01L 45/146* (2013.01); *H01L 45/148* (2013.01); *G11C 2213/33* (2013.01); *G11C 2213/34* (2013.01); *G11C 2213/51* (2013.01); *G11C 2213/54* (2013.01); *G11C 2213/72* (2013.01); *G11C 2213/73* (2013.01); *H01L 27/2463* (2013.01)

(58) Field of Classification Search
None
See application file for complete search history.

(56) References Cited

U.S. PATENT DOCUMENTS

2007/0171736 A1* 7/2007 Nowak et al. ................. 365/200
2012/0168705 A1* 7/2012 Liu et al. ........................... 257/4

* cited by examiner

*Primary Examiner* — James G Norman
(74) *Attorney, Agent, or Firm* — Amin, Turocy & Watson, LLP

(57) ABSTRACT

Providing for two-terminal memory having an inherent rectifying characteristic(s) is described herein. By way of example, the two-terminal memory can be a resistive switching device having one or more "on" states and an "off" state, to facilitate storage of digital information. A conductive filament can be electrically isolated from an electrode of the two-terminal memory by a thin tunneling layer, which permits a tunneling current for voltages greater in magnitude than a positive rectifying voltage or a negative rectifying voltage. The two-terminal memory cell can therefore have high resistance to small voltages, mitigating leakage currents in an array of the two-terminal memory cells. In addition, the memory cell can be conductive above a rectifying voltage, enabling reading of the memory cell in response to a suitable read bias, and erasing of the memory cell in response to a suitable negative erase bias.

20 Claims, 12 Drawing Sheets

ENERGY BAND DIAGRAMS
400

BEFORE EQUILIBRIUM
400A

AT EQUILIBRIUM (@ 0volts)
400B

$T_{1E}$: TUNNELING DISTANCE BETWEEN TE AND TE/QD
$T_{2E}$: TUNNELING DISTANCE BETWEEN TE/QD AND BE

TWO-TERMINAL MEMORY WITH INTRINSIC RECTIFYING CHARACTERISTIC

CROSS-REFERENCE TO RELATED APPLICATION

The present application for patent claims priority to non-provisional patent application Ser. No. 61/785,938 entitled RRAM WITH BUILT-IN RECTIFYING BEHAVIOR and filed Mar. 14, 2013, which is incorporated by reference in its entirety for all purposes.

TECHNICAL FIELD

This application relates generally to two-terminal memory cell technology, e.g., a two-terminal memory device having intrinsic rectifying characteristics.

BACKGROUND

The inventors of the present disclosure have been focusing research in the area of resistive memory within the field of integrated circuit technology. While much of resistive memory technology is in the development stage, various technological concepts for resistive memory have been demonstrated by the inventors, and are in one or more stages of verification to prove or disprove associated theory(ies). The inventors believe that resistive memory technology promises to hold substantial advantages over semiconductor transistor-based technologies in the electronics industry.

The semiconductor transistor has been the basis of electronic memory and processing devices for the past several decades. Over time, advancement in technology has roughly followed Moore's Law, which predicts an increase in a number of semiconductor devices, such as transistors, that can be fabricated on a given geometric area of a semiconductor chip. One implication of increasing number of semiconductor devices is increasing memory capacity and processing power for the semiconductor chip and associated electronic devices. Moore's Law has been fairly accurate at predicting the advancement of semiconductor technology up to the present.

The inventors of the disclosed subject matter have worked with two-terminal memory devices, such as resistive memory, as a replacement for three-terminal semiconductor transistors. Based on their experience in the field, mathematical predictions and test results, the inventors believe that two-terminal memory devices can overcome drawbacks of three-terminal semiconductor transistors in various categories related to performance and reliability. Examples include write, erase and access times, data reliability, device density, and others. Accordingly, the inventors are in the process of discovering new ways to create or fabricate two-terminal memory technologies and how they can replace conventional micro electronic systems and devices.

SUMMARY

The following presents a simplified summary of the specification in order to provide a basic understanding of some aspects of the specification. This summary is not an extensive overview of the specification. It is intended to neither identify key or critical elements of the specification nor delineate the scope of any particular embodiments of the specification, or any scope of the claims. Its purpose is to present some concepts of the specification in a simplified form as a prelude to the more detailed description that is presented in this disclosure.

Various embodiments of the subject disclosure provide for two-terminal memory having an inherent rectifying characteristic(s). In some embodiments, the two-terminal memory can be a resistive switching device having one or more "on" states and an "off" state, to facilitate storage of digital information. Additionally, the two-terminal memory can comprise a rectifying characteristic when in the "on" state(s) that resists conduction of current at the two-terminal memory for a small forward or a small reverse voltage.

In additional embodiments, a disclosed two-terminal memory can comprise a tunneling layer positioned between a switching layer and an electrode. The switching layer can be permeable to ions of a second electrode of the two-terminal memory, whereas the tunneling layer can be formed of a stoichiometric process that resists or prevents migration of ions into the tunneling layer. A conductive filament formed within the switching layer, in combination with the tunneling layer and the electrode can form a tunneling diode having a rectifying characteristic. This rectifying characteristic can maintain the two-terminal memory in a high resistance state for a relatively low forward bias voltage or a relatively low reverse bias voltage. Moreover, a suitable reverse bias voltage can facilitate erasure of the two-terminal memory cell via a deformation of the conductive filament. The two-terminal memory can therefore be fully programmable, erasable, readable, re-programmable, or the like, while maintaining the rectifying characteristic.

In another embodiment the subject disclosure provides a memory cell comprising a bottom electrode and a top electrode comprising a material that is electrically conductive and configured to be ionized under suitable applied bias. Additionally, the memory cell can comprise a switching layer comprising a material that is electrically resistive and at least in part permeable to ions of the top electrode, wherein a subset of the ions migrate into the switching layer in response to application of a program voltage to the memory cell and form a conductive filament through at least a portion of the switching layer, and further wherein the conductive filament is at least in part deformed in response to application of an erase voltage having an opposite bias of the program voltage. Furthermore, the memory cell can comprise a tunneling layer positioned between the switching layer and the bottom electrode that is electrically resistive and non-permeable to the ions, the tunneling layer facilitates a tunneling current between the conductive filament and the bottom electrode.

According to another embodiment, there is disclosed a method of fabricating a memory cell. The method can comprise forming a bottom electrode and forming a tunneling layer according to a stoichiometric or near stoichiometric process that is electrically resistive and resists migration of at least some ions related to the memory cell into the tunneling layer. Further, the method can comprise forming a switching layer that is electrically resistive according to an amorphous process that facilitates permeability of the ions within the switching layer. In addition to the foregoing, the method can comprise forming a top electrode providing a source of the ions; wherein forming the tunneling layer further comprises selecting a thickness for the tunneling layer configured to facilitate a tunneling current between at least the bottom electrode and a conductive filament of the ions formed within the switching layer in response to a program voltage applied to the memory cell.

In one or more other embodiments, the subject disclosure provides an electronic device. The electronic device can comprise a memory configured to store instructions for operating the electronic device and comprising at least one memory cell, a memory controller configured to operate the memory and a processor communicatively connected to the memory and configured to execute the instructions. Moreover, the memory cell can comprise a bottom electrode, a tunneling layer, a switching layer and a top electrode, the memory controller configured to program the at least one memory cell via a program bias and to erase the at least one memory cell via an erase bias, the at least one memory cell configured to form a high resistance state in response to the erase bias and configured to form a low resistance state in response to the program bias, and configured to have a rectifying resistance in the low resistance state to voltages between $-V_n$ and $V_p$. In some embodiments, $V_n$ can have a larger magnitude than $V_p$; in other embodiments magnitudes of $V_n$ and $V_p$ can be substantially similar.

According to another embodiment, the subject disclosure provides a method of fabricating a memory. The method can comprise forming a channel region for an array of transistors in a semiconductor substrate, the channel region arranging the array of transistors electrically in series from source to drain and forming a set wordlines for the memory that serve as respective control gates for respective ones of the array of transistors. Furthermore, the method can comprise forming a set of two terminal switching devices arranged electrically in series from respective first terminals to respective second terminals of the set of two terminal switching devices and connecting one of the set of two terminal switching devices in parallel with one of the array of transistors.

DETAILED DESCRIPTION OF THE DRAWINGS

Various aspects or features of this disclosure are described with reference to the drawings, wherein like reference numerals are used to refer to like elements throughout. In this specification, numerous specific details are set forth in order to provide a thorough understanding of this disclosure. It should be understood, however, that certain aspects of the subject disclosure may be practiced without these specific details, or with other methods, components, materials, etc. In other instances, well-known structures and devices are shown in block diagram form to facilitate describing the subject disclosure;

DETAILED DESCRIPTION

Figure 1:
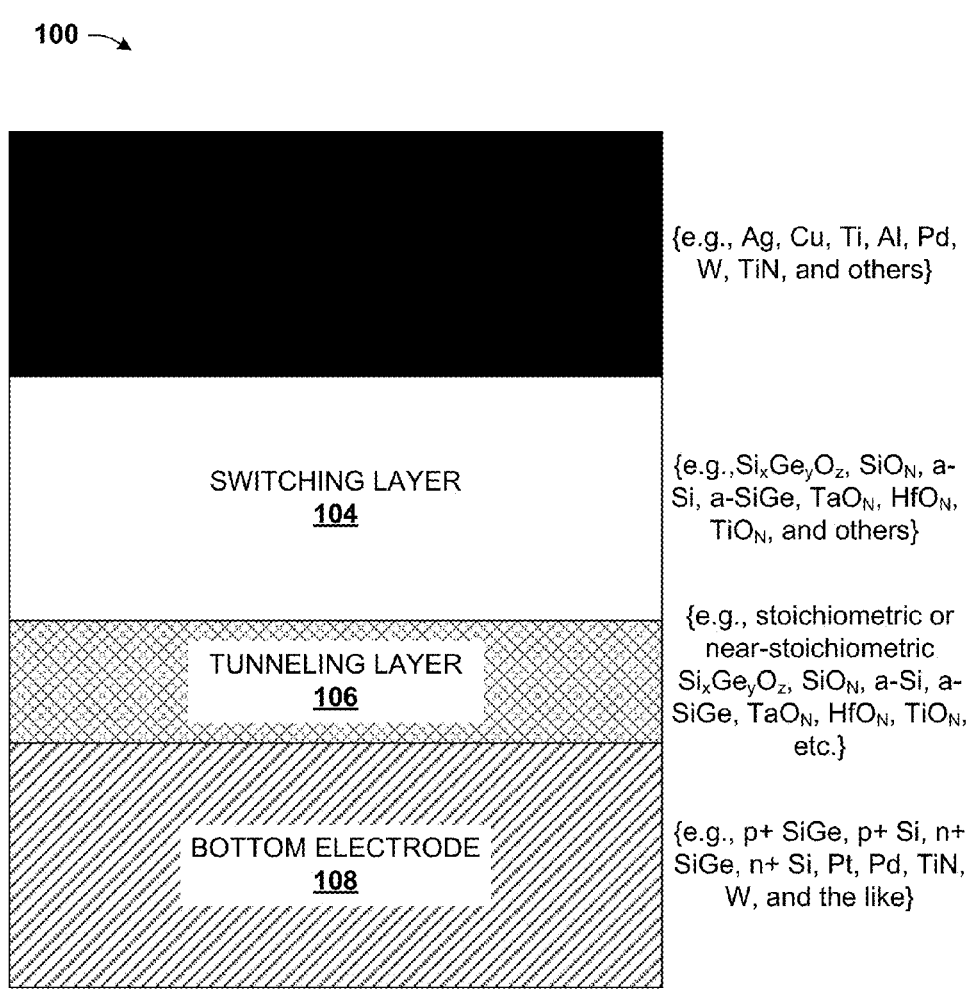
FIG. 1 illustrates a block diagram of an example two-terminal memory with rectifying properties according to some embodiments of the subject disclosure.

This disclosure relates to two-terminal memory cells employed for digital information storage. In some embodiments, the two-terminal memory cells can include a resistive technology, such as a resistive-switching two-terminal memory cells. Resistive-switching two-terminal memory cells (also referred to as resistive-switching memory cells or resistive-switching memory), as utilized herein, comprise circuit components having two conductive contacts (also referred to herein as electrodes or terminals) with an active region (also referred to as a switching layer) between the two conductive contacts. The active region of the two-terminal memory device, in the context of resistive-switching memory, exhibits a plurality of stable or semi-stable resistive states, each resistive state having a distinct electrical resistance. Moreover, respective ones of the plurality of states can be formed or activated in response to a suitable electrical signal applied at the two conductive contacts. The suitable electrical signal can be one or more specific voltage values, one or more specific current values, pulses having controlled duration or widths, pulses having controlled amplitudes or heights, signals of specific polarities, or the like, or a suitable combination thereof. An example of a resistive switching two-terminal memory device, though not exhaustive, can include a resistive random access memory (RRAM).

Embodiments of the subject disclosure can provide a filamentary-based memory cell. One example of a filamentary-based memory cell can comprise: a p-type or n-type silicon (Si) bearing layer (e.g., p-type or n-type polysilicon, p-type or n-type SiGe, etc.), a resistive switching layer (RSL) and an active metal layer for providing filament forming ions to the RSL. The p-type or n-type Si bearing layer can include a p-type or n-type polysilicon, p-type or n-type SiGe, or the like. The RSL (which can also be referred to in the art as a resistive switching media (RSM)) can comprise, e.g., an undoped amorphous Si layer, a semiconductor layer having intrinsic characteristics, a Si sub-oxide (e.g., SiOx wherein x has a value between 0.1 and 2), metallic oxide (e.g. Zinc Oxide) and so forth. Examples of the active metal layer can include, among others: silver (Ag), gold (Au), titanium (Ti), titanium-nitride (TiN) or other suitable compounds of titanium, nickel (Ni), copper (Cu), aluminum (Al), chromium (Cr), tantalum (Ta), iron (Fe), manganese (Mn), tungsten (W), vanadium (V), cobalt (Co), platinum (Pt), and palladium (Pd). Other suitable conductive materials, as well as compounds or combinations of the foregoing or similar materials can be employed for the active metal layer in some aspects of the subject disclosure. Some details pertaining to embodiments of the subject disclosure similar to the foregoing example can be found in the following U.S. patent applications that are licensed to the assignee of the present application for patent: application Ser. No. 11/875,541 filed Oct. 19, 2007 and application Ser. No. 12/575,921 filed Oct. 8, 2009, each of which are incorporated by reference herein in their respective entireties and for all purposes.

It should be appreciated that various embodiments herein may utilize a variety of memory cell technologies, having different physical properties. For instance, different resistive-switching memory cell technologies can have different discrete programmable resistances, different associated program/erase voltages, as well as other differentiating characteristics. For instance, various embodiments of the subject disclosure can employ a bipolar switching device that exhibits a first switching response (e.g., programming to one of a set of program states) to an electrical signal of a first polarity and a second switching response (e.g., erasing to an erase state) to the electrical signal having a second polarity. The bipolar switching device is contrasted, for instance, with a unipolar device that exhibits both the first switching response (e.g., programming) and the second switching response (e.g., erasing) in response to electrical signals having the same polarity and different magnitudes.

Where no specific memory cell technology or program/erase voltage is specified for the various aspects and embodiments herein, it is intended that such aspects and embodiments incorporate any suitable memory cell technology and be operated by program/erase voltages appropriate to that technology, as would be known by one of ordinary skill in the art or made known by way of the context provided herein. It should be appreciated further that where substituting a different memory cell technology would require circuit modifications that would be known to one of ordinary skill in the art, or changes to operating signal levels that would be known to one of such skill, embodiments comprising the substituted memory cell technology(ies) or signal level changes are considered within the scope of the subject disclosure.

The inventors of the present application are of the opinion that two-terminal memory devices, such as resistive-switching memory devices, have various advantages in the field of electronic memory. For example, resistive-switching technology can generally be small, consuming silicon area on the order of $4F^2$ per resistive-switching device where F stands for the minimum feature size of a technology node (e.g., a memory cell comprising two resistive-switching devices would therefore be approximately $8F^2$ if constructed in adjacent silicon space). Non-adjacent resistive-switching devices, e.g., stacked above or below each other, can consume as little as $4F^2$ for a set of multiple non-adjacent devices. Moreover, multi-bit devices having two, three or more bits (e.g. resistance states) per memory cell can result in even greater densities in terms of bits per silicon area consumed. These advantages can lead to great semiconductor component density and memory density, and low manufacturing costs for a given number of digital storage bits. The inventors also believe that resistive-switching memory can exhibit fast programming speed and low programming current, and smaller cell sizes enabling greater component densities. Other benefits include non-volatility, having the capacity to store data without continuous application of power, and capacity to be built between metal interconnect layers, enabling resistive-switching based devices to be usable for two-dimension as well as three-dimension semiconductor architectures.

The inventors of the subject application are familiar with additional non-volatile, two-terminal memory structures. For example, ferroelectric random access memory (RAM) is one example. Some others include magneto-resistive RAM, organic RAM, phase change RAM and conductive bridging RAM, and so on. Two-terminal memory technologies have differing advantages and disadvantages, and trade-offs between advantages and disadvantages are common. For instance, various subsets of these devices can have relatively fast switching times, good durability, high memory density, low cost fabrication, long life, or the like, or combinations thereof. Meanwhile, the various subsets can also be difficult to fabricate, have compatibility problems with many common CMOS fabrication processes, poor read performance, small on/off resistance ratios, small on/off resistance ratios (e.g., leading to small sensing margin) or poor thermal stability, as well as other problems. Though resistive-switching memory technology is considered by the inventors to be one of the best technologies having the most benefits and least detriments, other two-terminal memory technologies can be utilized for some of the disclosed embodiments, where suitable to one of ordinary skill in the art.

To program a filamentary-based resistive-switching memory cell, a suitable program voltage can be applied across the memory cell causing a conductive filament to form through a relatively high electrical resistance portion of the memory cell. This causes the memory cell to change from a relatively high resistive state, to a relatively low resistive state. In some resistive-switching devices, an erase process can be implemented to deform the conductive filament, at least in part, causing the memory cell to return to the high resistive state from the low resistive state. This change of state, in the context of memory, can be associated with respective states of a binary bit. For an array of multiple memory cells, a word(s), byte(s), page(s), block(s), etc., of memory cells can be programmed or erased to represent respective zeroes or ones of binary information, and by retaining those states over time in effect storing the binary information.

Viewed broadly, embodiments of the present disclosure have the potential to replace other types of memory existing in the marketplace due to the numerous advantages over competing technologies. However, the inventors of the subject disclosure believe that what is sometimes referred to as the sneak path problem is an obstacle for resistive switching memory cells to be used in high density data storage applications. A sneak path (also referred to as "leak path") can be characterized by undesired current flowing through neighboring memory cells, which can be particularly evident in large passive memory crossbar arrays, particularly in connection with cells in an "on" state (relatively low resistance state).

In more detail, sneak path current can result from a voltage difference across adjacent or nearby bitlines of a memory array. For instance, a memory cell positioned between metal inter-connects (e.g., bitlines and wordlines) of a crossbar array may not be a true electrical insulator, and thus a small amount of current can flow in response to the aforementioned voltage differences. Further, these small amounts of current can add together, particularly when caused by multiple voltage differences observed across multiple metal inter-connects. During a memory operation, sneak path current(s) can co-exist with an operating signal (e.g., program signal, erase signal, read signal, etc.) and reduce operational margin, for example, the current and/or voltage margin between reading a programmed cell (associated with a first physical state) and an erased cell (associated with a second physical state). For instance, in conjunction with a read operation on a selected memory cell, sneak path current sharing a read path with the selected memory cell can add to a sensing current, reducing sensing margin of read circuitry. In addition to increased power consumption and joule heating, and the detriments related thereto, sneak path currents can lead to memory cell errors—a problem that can undermine reliability in the memory itself.

One way the inventor has determined to mitigate the problem of sneak path current is to employ a 1T-1R memory array architecture. The 1T-1R architecture includes a transistor switch with each resistive switching device. The transistor switch can be utilized to deactivate the resistive switching memory device (e.g., isolate from one or more neighboring memory devices) when not selected for a memory operation. The transistor in effect can be turned "off", greatly reducing current flow in series with the resistive switching device, even when the resistive switching device itself is programmed, or in an "on" state (facilitating much higher current flow through the resistive switching element itself). However, the 1T-1R model has a cost in power consumption and die size (or memory cells per unit area). An improvement upon the 1T-1R architecture is a 1T-xR architecture, where x is an integer greater than 1. To accomplish this, a memory cell is combined with some other sneak-path mitigation technique so that multiple resistive switching memory cells can be activated or deactivated by a single transistor (e.g., a select transistor). The subject disclosure provides for a memory cell having a non-linear current-voltage relationship, having a non-zero positive rectifying voltage or a non-zero negative rectifying voltage that causes a non-linear change from a high resistance state to a low resistance state (see, e.g., co-pending U.S. patent application Ser. No. 13/149,757 filed May 31, 2011, which is incorporated by reference herein in its entirety and for all purposes).

Disclosed embodiments can comprise a discrete stack of contiguous materials forming a resistive switching device having one or more rectifier characteristics. In a particular aspect(s), the discrete stack can be configured to form a tunnel diode when programmed. This can be accomplished, for example, by forming a conductive filament within the discrete stack that approximates a quantum dot, in conjunction with a tunneling layer that separates the conductive filament from a bottom electrode by a predetermined distance. The predetermined distance can be selected to resist conventional current flow from the conductive filament to a bottom electrode of the discrete stack, but permit a tunneling current under suitable conditions. For instance, the discrete stack can maintain a high resistance—even when programmed—for voltages lower than about a positive (or forward bias) rectifier voltage, $V_p$. Alternatively, or in addition, the discrete stack can maintain the high resistance when programmed for negative voltages of magnitude less than a negative (or reverse bias) rectifier voltage, $-V_n$. The non-negative rectifier voltage(s) can greatly mitigate sneak path currents in an array of memory cells, so long as sneak-path related voltages do not exceed $V_p$ or $-V_n$. Solid state memory cells with such rectifier characteristics can facilitate a 1T-xR memory cell architecture with relatively large 'x' values, providing high speed, scalable memory below 20 nanometers (nm), with reduced power consumption and increased memory density achievable through the 1T-xR memory model.

Referring now to the drawings, FIG. 1 illustrates a block diagram of an example two-terminal memory cell 100 according to one or more disclosed embodiments. Memory cell 100 can have a rectifying characteristic(s), mitigating leakage among a group of memory cells 100 implemented as part of a memory array (e.g., see FIG. 3, infra). This can facilitate implementation of a workable 1T-xR memory cell model having relatively large positive values of x (e.g., where x is 8, 16, 32, 64, 128, 256, and so on). In addition, two-terminal memory cell 100 can be implemented with a resistive-switching technology (e.g., a resistive random access memory [RRAM], . . . ) expected by the inventors to have relatively fast switching times, fast read times, high scalability, good memory density as well as scalability below 20 nm. Two-terminal memory cell 100 therefore can provide significant advantages over existing memory technologies.

As depicted by FIG. 1, memory cell 100 can comprise a top electrode 102 adjacent to a switching layer 104. Top electrode 102 can be made of an electrically conductive material, providing free ions in response to a suitable stimulus (e.g., an electric field). In some cases, top electrode 102 comprises a metal material that produces free ions at the interface of switching layer 104 in response to an applied electric field. In some embodiments, top electrode 102 is an elemental metal and is not an ionically bonded material. Switching layer 104 can be a resistive material that is at least in part permeable to migration of the free ions of top electrode 102. Accordingly, in response to a suitable stimulus (e.g., a program signal), free ions of top electrode 102 can migrate within switching layer 104 forming a region or filament of conductive ions within switching layer 104. This region or filament is referred to as a conductive filament (e.g., see FIG. 2, infra), and can facilitate a change in state of switching material 104 from relatively high resistance to relatively low resistance (or relatively high conductance). This change of state can in turn form the basis for programming memory cell 100. It should be appreciated that switching layer 104 can be erased, for example in response to a second suitable stimulus (e.g., an erase signal). The erase signal can at least in part deform the conductive filament, restoring switching layer 104 approximately to the relatively high resistance state.

In various embodiments of the subject disclosure, top electrode 102 can be made of one or more conductive materials providing free ions, as described above. Examples can include Ag, Cu, Al, Pd, W, Pt, or the like, or a suitable combination thereof. Top electrode 102 may also include additional layers (some very thin, e.g. 2 to 3 nm), such as Ti, TiN, W, or the like, above top electrode 102, and/or between top electrode 102 and switching layer 104 as barrier layers, or the like. Moreover, switching layer 104 can be formed of a suitable material having relatively high resistance and permeability to ions of top electrode 102. Examples of materials suitable for switching layer 104 can include Silicon Germanium Oxide ($Si_XGe_YO_Z$, where X, Y and Z are suitable positive numbers), a silicon oxide, e.g. $SiO_N$ (where N is a suitable positive number), amorphous Silicon (a-Si), amorphous SiGe (a-SiGe), $TaO_B$ (where B is a suitable positive number), $HfO_C$ (where C is a suitable positive number), $TiO_D$ (where D is a suitable positive number), a silicon sub-oxide (e.g., SiOx wherein x has a value between 0.1 and 2), or the like, or suitable combinations thereof.

In addition to the foregoing, memory cell 100 can comprise a tunneling layer 106. Tunneling layer 106 can be electrically resistive, and can be configured to be resistant or non-permeable to the free ions of top electrode 102. Accordingly, tunneling layer 106 can be configured to form a barrier (e.g., a physical barrier, an electrical conductivity barrier) between a conductive filament formed within switching layer 104 and a bottom electrode 108 of memory cell 100. Although the barrier can resist direct current flow, tunneling layer 106 can be configured to permit a tunneling current between the conductive filament and bottom electrode (e.g., see energy diagrams of FIGS. 4-7, infra) in response to a suitable signal (e.g., a read signal) applied to memory cell 100 when memory cell 100 is programmed (e.g., the conductive filament is formed within switching layer 104). If a signal is applied to memory cell 100 and has insufficient electrical power to activate the tunneling current, tunneling layer 106 can resist current flow through memory cell 100.

As one example embodiment to illustrate the foregoing, when memory cell 100 is programmed, memory cell 100 can retain a high resistive state until a threshold positive or negative voltage magnitude is applied to memory cell 100. In response to a voltage magnitude below the threshold magnitude, memory cell 100 remains resistive to current. When the voltage magnitude reaches or exceeds the threshold magnitude, a tunneling current occurs at tunneling layer 106 and memory cell 100 becomes conductive. Accordingly, memory cell 100 can resist relatively low magnitude current or voltages, such as leakage currents, observed on shared wordlines or shared bitlines in a 1T-xR memory array model, having x values greater than one. The capacity to resist leakage currents can maintain sensing margin in a memory array, and permitting greater memory density designs for two-terminal memory devices. Accordingly, memory cell 100 can provide significant advantages over existing memory designs.

In various embodiments, tunneling layer 106 can be created with a stoichiometric process, or a near stoichiometric process (e.g., substantially stoichiometric). The process can be designed to form tunneling layer 106 as a solid-state structure that is at least in part non-permeable to free ions of top electrode 102. In one embodiment, the near stoichiometric process can form tunneling layer 106 in a crystalline structure, for example, a poly crystalline structure. A thickness of tunneling layer 106 can be selected to provide the tunneling current described above, in response to a suitable read signal (or erase signal, in the context of a negative bias). In some embodiments, tunneling layer 106 can be selected to have a thickness between about 0.5 nm and about 5.0 nm. In alternative or additional embodiments, switching layer 104 can have a thickness between about 1 nm and about 20 nm. In at least one embodiment of the subject disclosure, the thickness of the tunneling layer 106 and the thickness of the switching layer can be defined by a mathematical relationship. For instance, the thickness of tunneling layer 106 can be between about one half and about one quarter of the thickness of switching layer 104.

According to one or more other embodiments, bottom electrode 108 can be formed of a suitable conductive material. Examples can include a p-type SiGe, a p-type Si, an n-type SiGe, an n-type Si, Pt, Pd, TiN, W, Cu, Al, or the like. In other aspects, suitable combinations of the foregoing conductive materials can be employed for bottom electrode 108.

Figure 2:
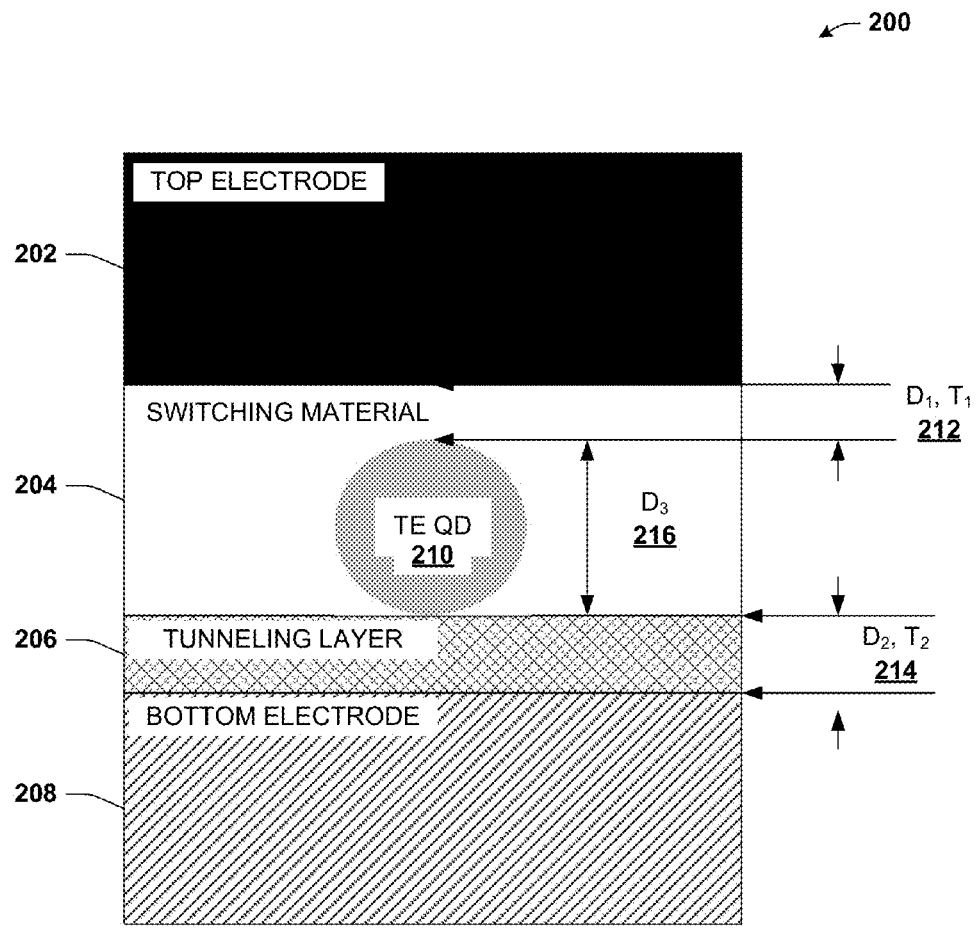
FIG. 2 depicts a block diagram of an example two-terminal memory cell having a conductive filament in response to a program voltage, in other embodiments.

FIG. 2 illustrates a block diagram of an example memory cell 200, according to additional embodiments of the subject disclosure. Memory cell 200 is depicted in a program state, during or following application of a suitable program signal to memory cell 200. While in the program state, memory cell 200 can resist conduction of current in response to a positive signal (e.g., voltage, current, pulse width, . . . ) of magnitude less than, $S_p$, or in response to a negative signal of magnitude less than $-S_n$. In some embodiments, $S_p$ and $S_n$ can be about the same magnitude (e.g., same voltage magnitude, current magnitude, pulse width), whereas in other embodiments $S_p$ and $S_n$ can have different magnitudes.

As depicted, memory cell 200 can comprise a top electrode 202 adjacent to a switching layer 204 comprising a switching material. In addition, a tunneling layer 206 can be positioned between switching layer 204 and a bottom electrode 208. In some disclosed embodiments, memory cell 200 can be substantially similar to memory cell 100 of FIG. 1, supra, whereas in other embodiments memory cell 200 can be at least in part different from memory cell 100. For example, in some embodiments, one or more other layers can be included in memory cell 200. For instance, an intermediary layer(s) can be instituted adjacent to one or more of the layers depicted in FIG. 2. As one example, a suitable material layer that mitigates or controls unintended oxidation of switching material 204 can be positioned between one or more layers of memory cell 200, such as between top electrode 202 and switching layer 204. As another example, in some embodiments, memory cell 200 can have fewer layers than depicted in FIG. 2. For instance, top electrode 202 or bottom electrode 208 can be removed, and switching material 204 or tunneling material 206 can electrically contact a conductive bitline or wordline of a memory array. Accordingly, it is to be appreciated that suitable variations of memory cell 200 known in the art or made known to one of ordinary skill in the art by way of the context provided herein are considered within the scope of the present disclosure.

As depicted, memory cell 200 can comprise a conductive filament comprised of ions from the top electrode. The conductive filament can be formed in response to applying a positive bias signal to top electrode 202, causing ions to be injected into switching layer 204. Moreover, tunneling layer 206 can provide a physical (and electrical) barrier between the conductive filament and bottom electrode 208.

In some embodiments, the conductive filament can form or approximate a quantum dot (e.g., when diameter and length of the filament is less than 10 nm) of top electrode ions (top electrode quantum dot 210, or TE QD 210). This can result from surface tension of the conductive filament within switching layer 204 causing the conductive filament as a whole to form a shape having a lower or lowest surface tension energy, e.g., a sphere. This effect of this surface tension and likelihood of seeking low surface tension form can increase in relation to decreasing thickness of switching layer 204 and controlled current conduction during programming of memory cell 200 and creation of TE QD 210. This controlled current conduction can include, for example, limiting a maximum current magnitude to reduce Joule heating. Thus, in some embodiments, a thinner switching layer 204 (e.g., 10 nm, 5 nm, etc.) is more likely to result in a conductive filament having a sphere or spheroid TE QD 210, resulting in a conductive filament gap between QE TD 210 and top electrode 202, as described in more detail below.

Tunneling layer 206 forms a physical barrier (e.g., a physical distance $D_2$ 214) and an electrical barrier (e.g., a tunneling distance $T_2$) between TE QD 210 and bottom electrode 208. Note that the physical distance and tunneling distance can be different depending on the applied signal. For instance, the physical distance is determined by the tunneling layer thickness whereas the tunneling distance can be altered by the applied signal magnitude, such as a suitable voltage magnitude (or, e.g., a controlled or suitable current magnitude, a suitable pulse width, series of pulses of controlled magnitude, and so forth). In some embodiments, TE QD 210 can have a physical distance $D_1$ 212 (and associated tunneling distance $T_1$) between TE QD 210 and top electrode 202 (e.g., where TE QD 210 forms a sphere, or the like to minimize or reduce surface tension energy). In other embodiments, TE QD 210 can extend to top electrode 202, such that $D_1$ 212 is zero. As depicted a diameter of TE QD 210 is given by $D_3$ 216.

In one or more embodiments, tunneling layer 206 can provide a negative differential resistance to memory cell 200, in response to small negative voltages. This negative differential resistance can result in an increase in resistivity for small negative voltages of magnitude greater than zero, and less than $-S_n$. This negative differential resistance can provide an effective resistance to leakage currents caused by a low magnitude negative bias observed at memory cell 200. Note that the negative differential resistance is a function of $D_2$ 214; a larger $D_2$ 214 can increase magnitude of the negative differential resistance, whereas a smaller $D_2$ 214 can decrease magnitude of the negative differential resistance. In addition to the foregoing, where $D_1$ 212 and $D_2$ 214 are non-zero, magnitude of $D_3$ 216 can affect magnitude of $S_n$.

For instance, a smaller $D_3$ 216 yielding smaller $T_1$ and larger $T_2$ at energy equilibrium can result in a smaller magnitude of $S_n$ (and potentially a more abrupt change in current in response to voltage applied to memory cell 200). Moreover, changes in magnitude of $D_1$ 212 and $D_2$ 214 can affect magnitudes of $S_n$, and $S_p$. For substantially zero $D_1$ 212 and $D_2$ 214, magnitudes of $S_n$ and $S_p$ approach zero, resulting in a near linear current-voltage curve for memory cell 200. Larger $D_1$ or $D_2$ values can result in an increase in magnitude of $V_n$. Likewise, employing materials with higher work functions for bottom electrode 208 can result in increased magnitude of $V_n$ and smaller magnitude of $V_p$. For example, with a bottom electrode 208 comprised of a p+ SiGe material, decreases in atomic fraction of Ge results in increased magnitude of $V_n$ and decrease in magnitude of $V_p$. Accordingly, rectifying characteristics of memory cell 200 can at least in part be controlled by selection of various materials for bottom electrode 208, top electrode 202 or selection of various thicknesses for tunneling layer 206 or switching layer 204, or a suitable combination thereof.

Operation of memory cell 200 can be based on application of a suitable signal across top electrode 202 and bottom electrode 208. TE QD 210 is formed within switching layer 204 in response to a suitable program signal. The program signal programs memory cell 200 to an 'on' state (e.g., relatively low resistance). Likewise, TE QD 210 can at least in part be deformed in response to a suitable erase signal. The erase signal erases memory cell 200 to an 'off' state (e.g., relatively high resistance). The electrical resistance of the 'off' state is determined by electrical resistance of switching layer 204. In contrast, the electrical conductivity of the 'on' state is determined by tunneling layer 206 and size of TE QD (e.g., tunneling distance $T_2$ of tunneling layer 206).

According to various theoretical models, the inventors believe that in the 'on' state, TE QD 210, tunneling layer 206 and bottom electrode 208 form or approximate a tunnel diode. The tunnel diode can suppress leakage current at small voltage biases on top electrode 202 for a range of voltage magnitudes between $V_p$ to $-V_n$. Values of $V_n$ and $V_p$ are determined by materials utilized for top electrode 202 and bottom electrode 208. For instance, a material with higher workfunction (e.g., p+ SiGe, p+ Si, . . . ) increases magnitude of $V_n$ while reducing magnitude of $V_p$. Actual leakage current observed at memory cell 200 can equate to a diode leakage current, which is controlled by magnitude of $T_2$. Thus, formation of QE TD 210 results in an 'on' state for memory cell 200 and forms a tunnel diode having intrinsic rectifying characteristics, as opposed to utilizing a separate extrinsic diode fabricated in series with memory cell 200.

In one or more embodiments, a magnitude of $D_2$ 214 can be about 4 nm or less when memory cell 200 is in an 'on' state. In other embodiments, a magnitude of $D_1$ 212 can be about 4 nm or less in the 'on' state. In at least one embodiment, $D_1$ 212 and $D_2$ 214 can each be between about 4 nm and about 0 nm, respectively.

Figure 3:
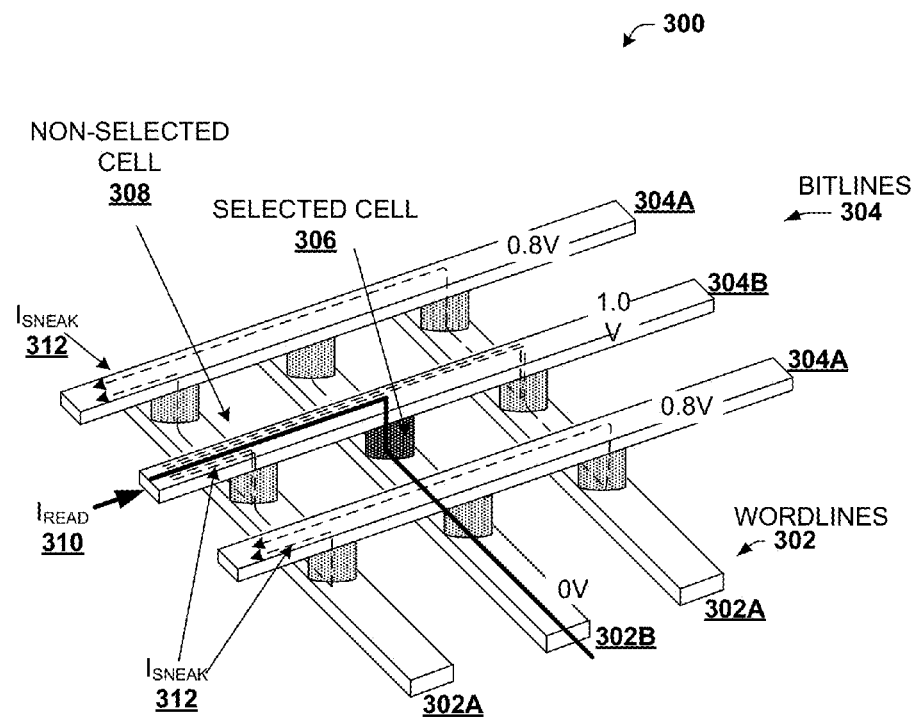
FIG. 3 depicts a diagram of an example crossbar memory architecture illustrating leak path mitigation according to one or more embodiments.

FIG. 3 illustrates an example system 300 comprising a memory array having a crossbar architecture of memory cells. System 300 is used to illustrate practical distinctions between memory cells that mitigate sneak path current in a program state versus memory cells that have much higher sneak path current in the program state (e.g., where the program state generally has a higher electrical conductivity compared with a an erase, or non-program state). Thus two different scenarios are presented. In both cases, system 300 includes various wordlines 302 and bitlines 304 in which a single cell among the array can be selected based upon an applied bias between a particular wordline and a particular bitline, with the selected cell representing the junction of the particular wordline and particular bitline. As a more specific example, bitlines 304 can include two un-selected bitlines 304A, and a selected bitline 304B. Likewise, wordlines 302 can include two un-selected wordlines 302A and a selected wordline 302B. A selected memory cell 306 (dark shading) of system 300 is located at a junction of selected wordline 302B and selected bitline 304B.

In both example scenarios discussed below, the selected memory cell 306 is in the "off" state (also referred to as the "erase" state) while cell 308 and other neighbors of cell 306 are in the "on" state (also referred to as the "program" state). Further assume that an applied bias (e.g., read voltage) is 1.0 V and this corresponds with an associated read current 310 for a cell in the "on" state of about 1.5 micro amps (µA), but of a significantly lower value if the cell is in the "off" state (e.g., about 15 nanoamps (nA) or less).

It is understood that different bitlines 304 observe small differences in voltage (e.g., resulting from differences in the program pattern in the array). For instance, selected bitline 304B connected to selected memory cell 306 (dark shading) experiences a read voltage of 1.0 volts; whereas un-selected wordlines 304A connected only to un-selected memory cells 308 (all lightly shaded cells) experience about 0.8 volts. This difference of 0.2 volts can result in several sneak path currents 312 throughout memory architecture 300, depicted by the dashed lines.

As described herein, a read operation generally involves measuring or sensing a magnitude of a current flowing through a selected memory cell in response to application of a read voltage to that selected memory cell. A read current, $I_{READ}$ 310 is depicted by a bold line, following a read path through selected bitline 304B, through selected memory cell 306, and out selected wordline 302B. Because of the difference in voltage on the un-selected bitlines 304A and selected bitline 304B, sneak path currents 312 (depicted by the dashed lines) are produced through those of the non-selected memory cells 308 that are located on un-selected wordlines 302A. Sneak path currents along un-selected wordlines 302A and un-selected bitlines 304A can add to (or subtract from, depending on polarity) the magnitude of $I_{READ}$ 310, distorting its value. For instance, if the net effect of the sneak currents is to increase $I_{READ}$ 310 by several tens of nA, then a significant loss of sensing margin for the 15 nA read current for an "off" state selected cell 306 is observed at memory architecture 300. This can negatively impact data integrity and performance of the read operations of memory cells of memory architecture 300. Moreover, if sneak currents net to increase $I_{READ}$ 310 on the order of about 15 nA, then selected memory cell 306, which is in the "off" state and therefore should have a read current 310 several times lower, might actually be sensed as being in the "on" state.

Thus, in a first case, consider the crossbar array of system 300 is populated with memory cells that have little to no sneak path current mitigation. In that case, read current 310 of about 15 nA flows through selected memory cell 306 and sneak path currents 312 are produced through the un-selected cells located on un-selected wordlines 302A. Assuming a substantially linear current-voltage relationship for these cells, the individual magnitudes of these sneak path currents is approximately 3 nA (e.g., if 1.0 V produces 15 nA then, linearly, 0.2 V produces about 3 nA). Hence, even though selected memory cell 306 is in the "off" state, selected bitline 304B can observe a significant current flow, resulting from 15 nA read current, plus 3 nA for each of the sneak path currents flowing through selected bitline 304B. Accordingly, a small number of sneak path currents can significantly reduce sensing margin. For example about five sneak path currents of 3 nA can double the above read current of 15 nA, to 30 nA through the selected bitline 304B. At some point, a sufficient number of sneak path currents can cause the "off" cell to be read as an "on" cell, thereby inducing memory error. To avoid memory error, therefore, the number of memory cells must be limited at least to fewer than those that would lead to memory error. Accordingly, sneak path currents tend to limit the number of resistive-switching memory cells that can be provided per transistor switch; said differently, sneak patch currents reduce the value of 'x' in the 1T-xR memory array model, thereby limiting the memory density of such a memory array.

However, if the current-voltage relationship is rectified at low memory cell voltages, then the magnitudes of these sneak path currents can be significantly reduced. So, in the second case, un-selected wordlines 302A can be floated or driven at 0.8 volts to minimize the voltage across memory cells of these wordlines. Further, consider the crossbar array of system 300 is populated with memory cells according to various embodiments described herein (e.g., solid state memory cell 100, 200, or the like), in which the cell exhibits a non-linear relationship between current and voltage near a rectifier voltage (e.g., positive rectifier voltage $V_p$, negative rectifier voltage $-V_n$, etc.). In that case, a voltage differential of 0.2 V, if smaller than the rectifier voltage, that produced a sneak current of 3 nA in the linear case might only produce a sneak current much smaller (e.g., 0.3 nA, 0.03 nA, . . . ) depending on the rectifier characteristics of the memory cell. Therefore, when compared to the non-rectified memory cells, the rectified memory cells provide a significantly larger margin for on-off state comparison and lower power consumption. This can result in larger arrays of resistive-switching memory cells per transistor switch, increasing memory density of a memory array.

Figure 4:
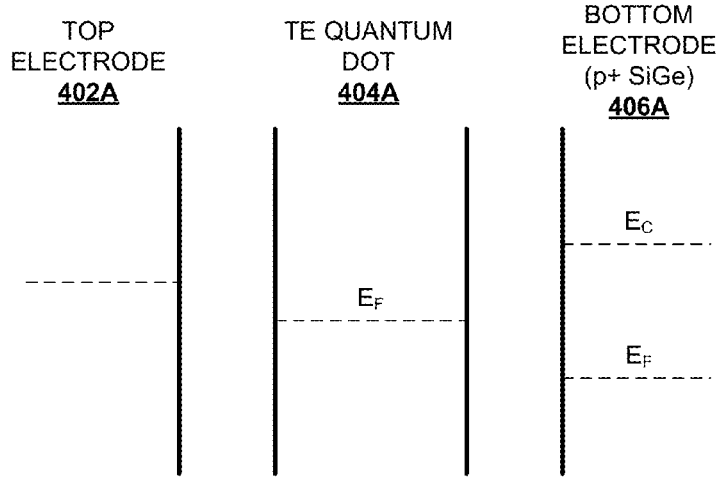
FIG. 4 illustrates example energy band diagrams for a memory cell having a conductive filament that approximates a quantum dot.
Figure 4:
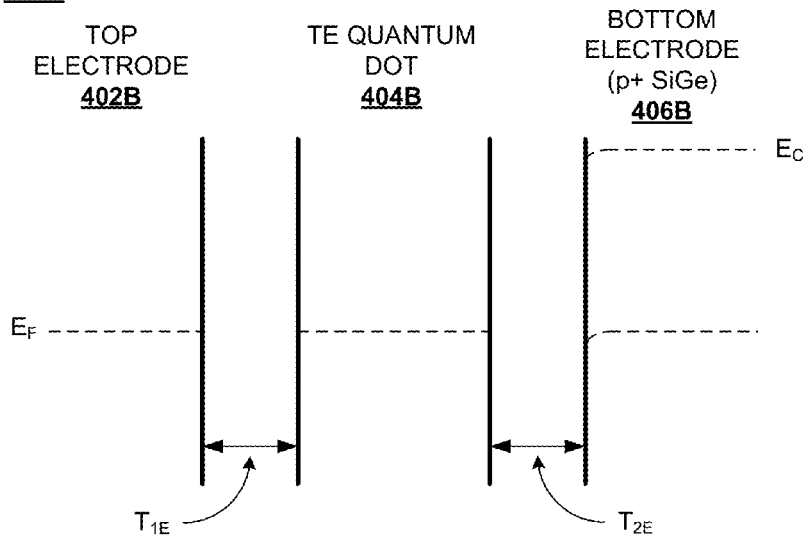

FIG. 4 depicts example energy band diagrams 400 for a memory cell having rectifying characteristics according to the subject disclosure. Examples of such a memory cell can include memory cell 100, memory cell 200, or the like, or suitable variations thereof made known to one of ordinary skill in the art by way of the context provided herein. Energy band diagrams 400 illustrate changes in energy of components of a memory cell before equilibrium, and after equilibrium. For purposes of explanation, energy band diagrams 400 will be described with respect to memory cell 200, and in particularly to memory cell 200 having a top electrode comprised of a suitable material having a work function of 4.3 eV, a bottom electrode comprised of a p+ type SiGe, and a TE QD with a diameter $D_3$ of about 4 nm. In at least one embodiment, the memory cell according to energy band diagrams 400 of FIG. 4 can have a switching layer and a tunneling layer comprised respectively of suitable insulating materials, though in other embodiments different suitable materials can be employed for the switching layer and tunneling layer.

Energy band diagrams 400 include before energy equilibrium diagram 400A and at equilibrium diagram 400B. Generally, the energy band diagrams 400 illustrate relative energy levels of a top electrode 402A, 402B, TE QD 404A, 404B and bottom electrode 406A, 406B of memory cell 200 in the respective before equilibrium diagram 400A and at equilibrium diagram 400B. Additionally, the TE QD 404A, 404B does not physically extend to the top electrode 402A, 402B in the examples of FIG. 4. Accordingly, a non-zero physical distance $D_1$ exists between TE QD 404A, 404B and the top electrode 402A, 402B, and non-zero tunneling distance $T_1$ exists between the TE QD 404A, 404B and the top electrode 402A, 402B. This distance $D_1$ and tunneling distance $T_1$ is represented by $T_{1E}$, and the depicted gap in energy diagrams 400 between the top electrodes 402A, 402B and TE QD 402A, 402B. Likewise, the tunneling layer creates a non-zero distance $D_2$ and tunneling distance $T_2$ between TE QD 404A, 404B and bottom electrode 406A, 406B, as depicted.

As observed at before equilibrium diagram 400A, the work function (Fermi energy level) of the top metal electrode 402A is higher than the Fermi energy level $E_F$ of the TE QD 404A due to the size dependent work function of nanometer scale metal (TE QD 404A). Likewise, the p+ SiGe bottom electrode has a Fermi energy level below that of TE QD 404A, and a conduction band energy above that of the top electrode 402A and TE QD 404A. As equilibrium diagram 400B illustrates, at 0 volts applied to memory cell 200, the Fermi levels of top electrode 402B, TE QD 404B and bottom electrode 406B are aligned at the same energy level. During the energy equilibrium process, bottom electrode 406B has a short ramp-up period, which quickly stabilizes at the Fermi level as well. These energy diagrams at equilibrium can change in response to program voltage applied to the memory cell, as is depicted in FIGS. 5-7.

Figure 5:
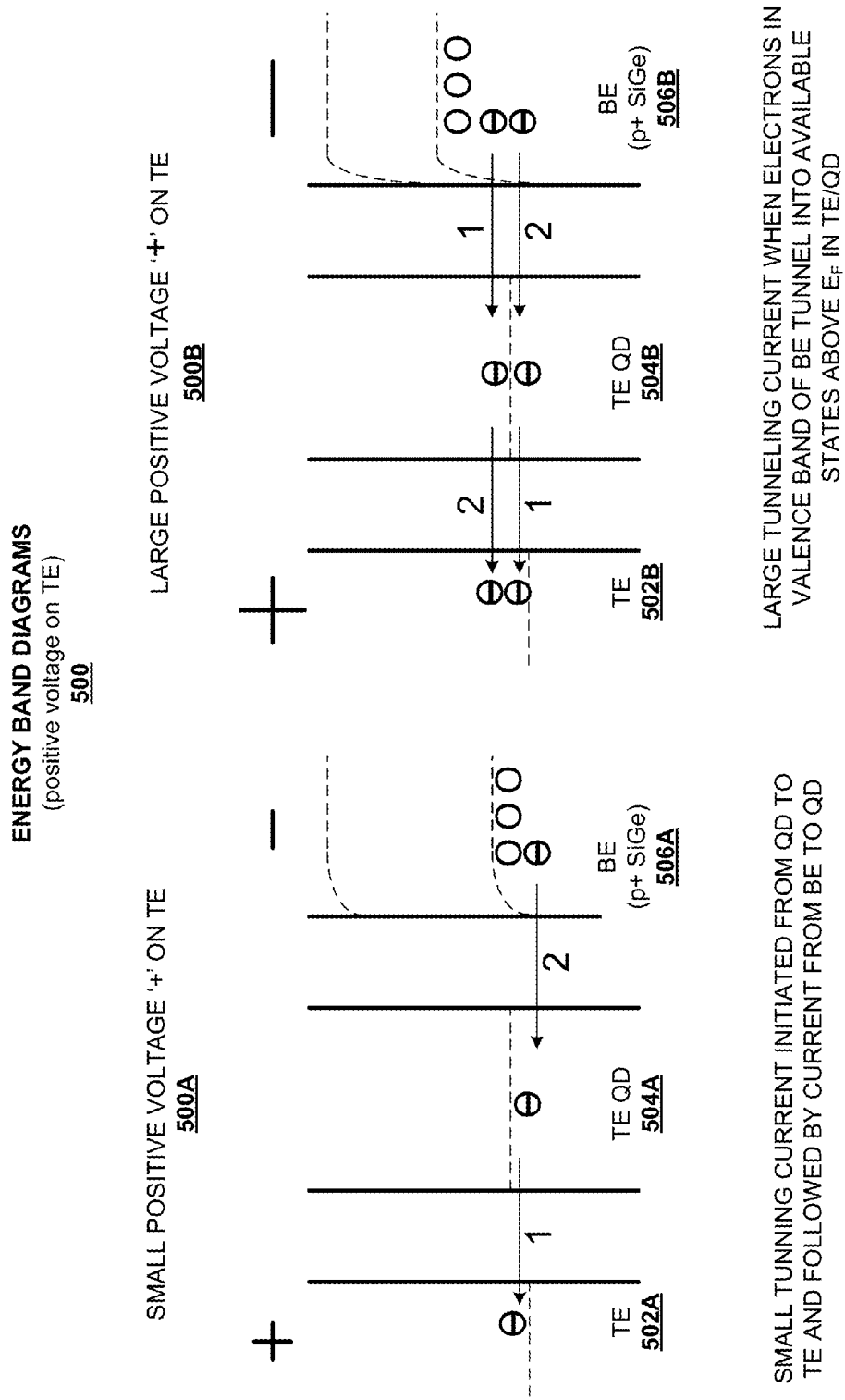
FIG. 5 depicts example energy band diagrams for the memory cell in response to small and large positive voltages.

FIG. 5 illustrates example energy band diagrams 500 for a memory cell, including a small positive voltage energy band diagram 500A and large positive voltage energy band diagram 500B. With respect to FIG. 5, the voltage is applied to the top electrode while the bottom electrode is grounded. In response to the small positive voltage (e.g., less than a read voltage), the energy level of TE 502A decreases relative to TE QD 504A, resulting in a small tunneling current being initiated between TE QD 504A and TE 502A. This creates available energy states for electron in TE QD 504A, resulting in electron tunneling from bottom electrode 506A to TE QD 504A. Hence net electrode flows from bottom electrode 506A to top electrode 502A. In FIG. 5, θ refers to an electron (e.g., negative charge ion) and ο refers to a hole (e.g., positive charge ion).

In response to the large voltage depicted at energy diagram 500B, the large voltage lowers energy at TE 502B resulting in a larger current from TE QD 504B to TE 502B (illustrates by the multiple electrons flowing from TE QD 504B to TE 502B). Additionally, a large energy increase is observed at BE 506B, which increases quite sharply compared to the moderate increase of the low positive voltage energy diagram 500A. In addition to the tunneling current component discussed in FIG. 500A, the large positive voltage on TE 502B results in large tunneling electrons from BE 506B to available energy states of TE QD 504B above the work function of TE QD 504B.

Figure 6:
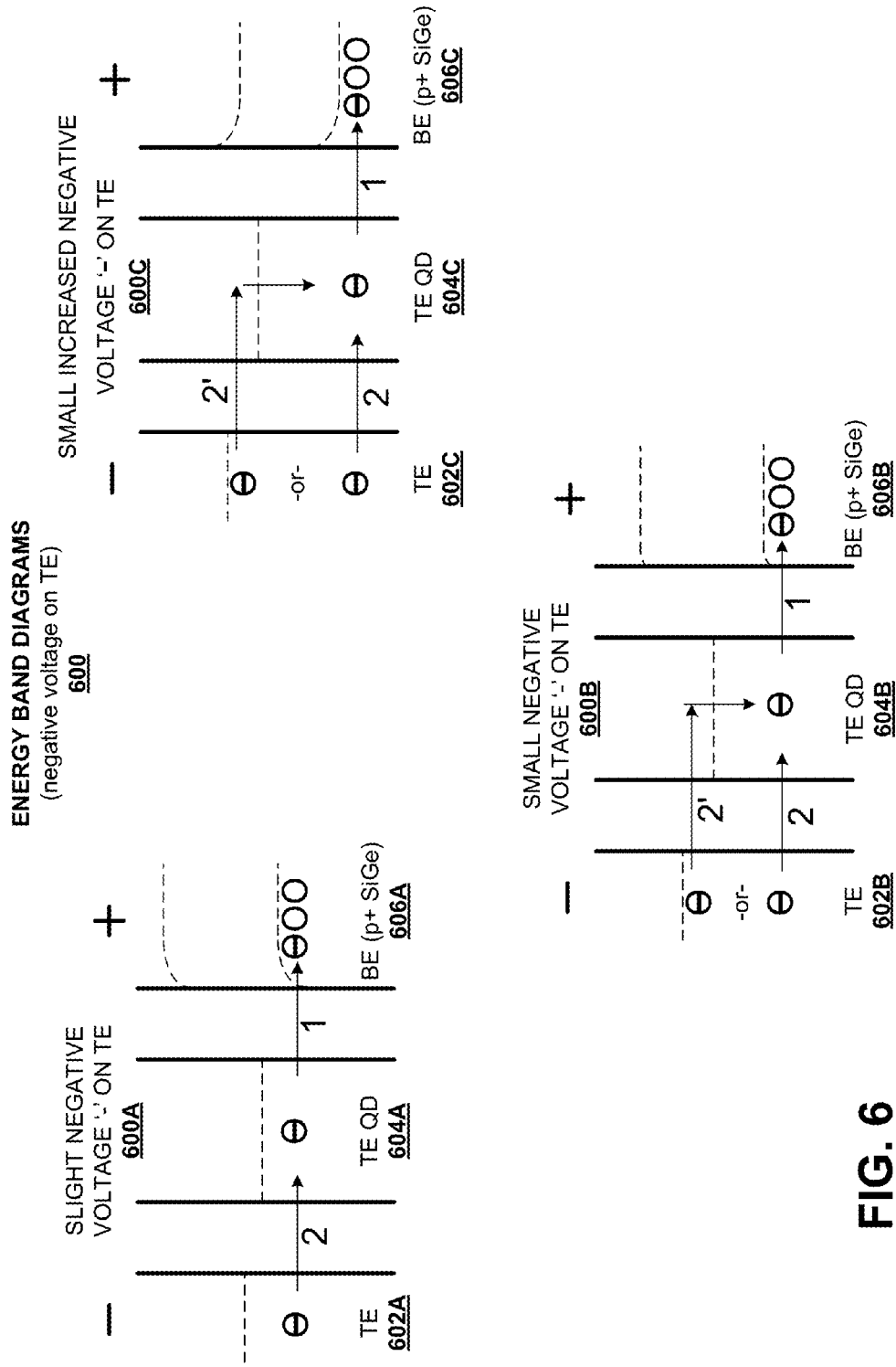
FIG. 6 illustrates example energy band diagrams for the memory cell in response to negative voltages of various magnitudes.
Figure 7:
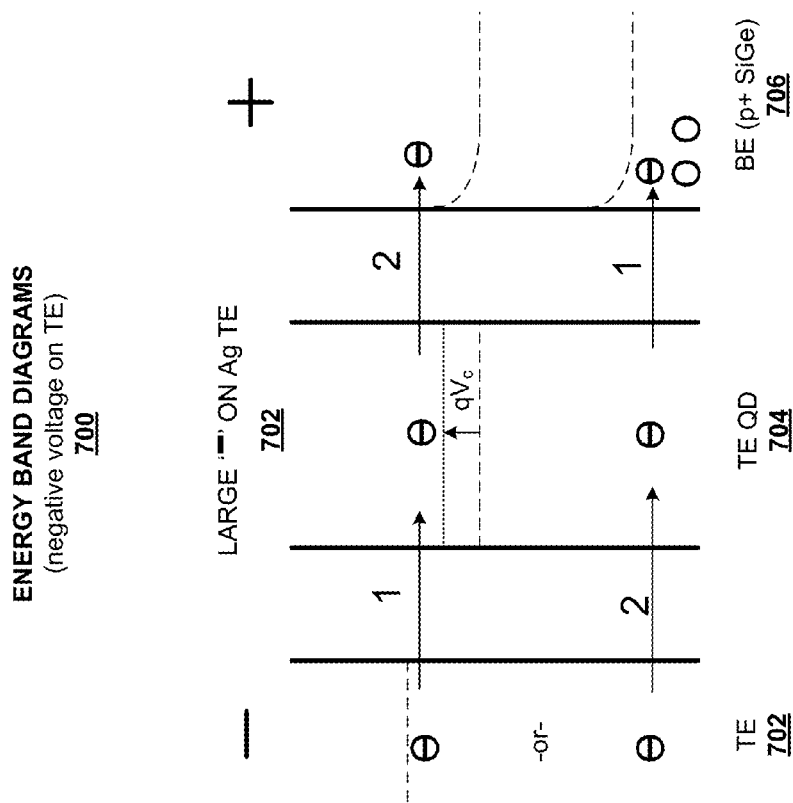
FIG. 7 depicts an example energy band diagram for the memory cell in response to a relatively large negative voltage.

FIG. 6 depicts a set of example energy band diagrams 600 for a memory cell observing negative biases of varying magnitude at a top electrode of a memory cell, in further aspects of the subject disclosure. Energy diagram 600A relates to a slight negative voltage, just greater in magnitude than zero volts of a negative bias, providing a tunneling distance $T_1$ slightly greater than that of zero bias (equilibrium). This results in a slight increase in energy of TE 602A relative to TE QD 604A, and a small electron tunneling in the direction illustrated. Moreover, energy at BE 606A is decreased relative to TE QD 604A, resulting in electron flow to BE 606A. Hence small tunneling current flows from BE 606A to TE 602A.

A second energy band diagram 600B relates to a small increase in the negative bias at top electrode 602B of a memory cell and a corresponding increase in $T_1$. The increased voltage results in increase in tunneling distance T1 and T2, reducing tunneling current. This can correspond with the negative differential voltage discussed above at FIG. 2, supra. Current becomes smaller as the negative bias on TE 602B increases and becomes smallest when approximately the sum of tunneling distance T1 and $T_2$ is largest, within a range of voltages having the negative differential resistance. Beyond the region of negative differential resistance depicted at energy band diagram 600C, an increase in negative bias at TE 602C causes an increase in current to TE QD 604C as $T_2$ starts to decrease (in the case where $T_1$ is not the limiting factor with respect to tunneling current, in other words where $T_2$ is greater than or equal to $T_1$; otherwise the combined tunneling distance of T1 and T2 has greater effect).

FIG. 7 depicts an energy band diagram 700 for a memory cell observing a large negative voltage at a top electrode 702. As one example, top electrode 702 can be comprised of Ag metal, but is not limited thereto. $T_1$ and $T_2$ become small for the memory cell associated with energy band diagram 700 due to large applied voltage, resulting in a large tunneling current. This also can cause charging of the TE QD 704 as a large amount of electrons is injected from TE 702 to TE QD 704. As an example, consider a 4 nm metal QD, and a 1 nm $D_2$. A corresponding capacitance of the QD can be approximately $10^{-17}$ Farads (F). An electron tunneling to such a TE QD 704 will increase the QD potential by $V_C=q/c$ which is approximately 0.02 volts. Thus, a few additional tunneling electrons from BE 706 to TE QD 704 can increase the effective voltage of TE QD 704 significantly (e.g., 10 electrons can cause an increase in 0.2 volts—quite large). This will have the effect of further decreasing the $T_2$ tunneling distance, as depicted by energy band diagram 700. Thus, a linear increase in negative bias on the TE can lead to a reduction in $T_2$ and a strong nonlinear increase in tunneling current between BE 706 and TE QD 704. This increased tunneling current results in an increase in charge (e.g., electrons) in the TE QD 704, which further decreases $T_2$ and again causes an increase in the tunneling current between BE 706 and TE QD 704. This can provide a significant current in response to quite small changes in voltage at the memory cell.

Figure 8:
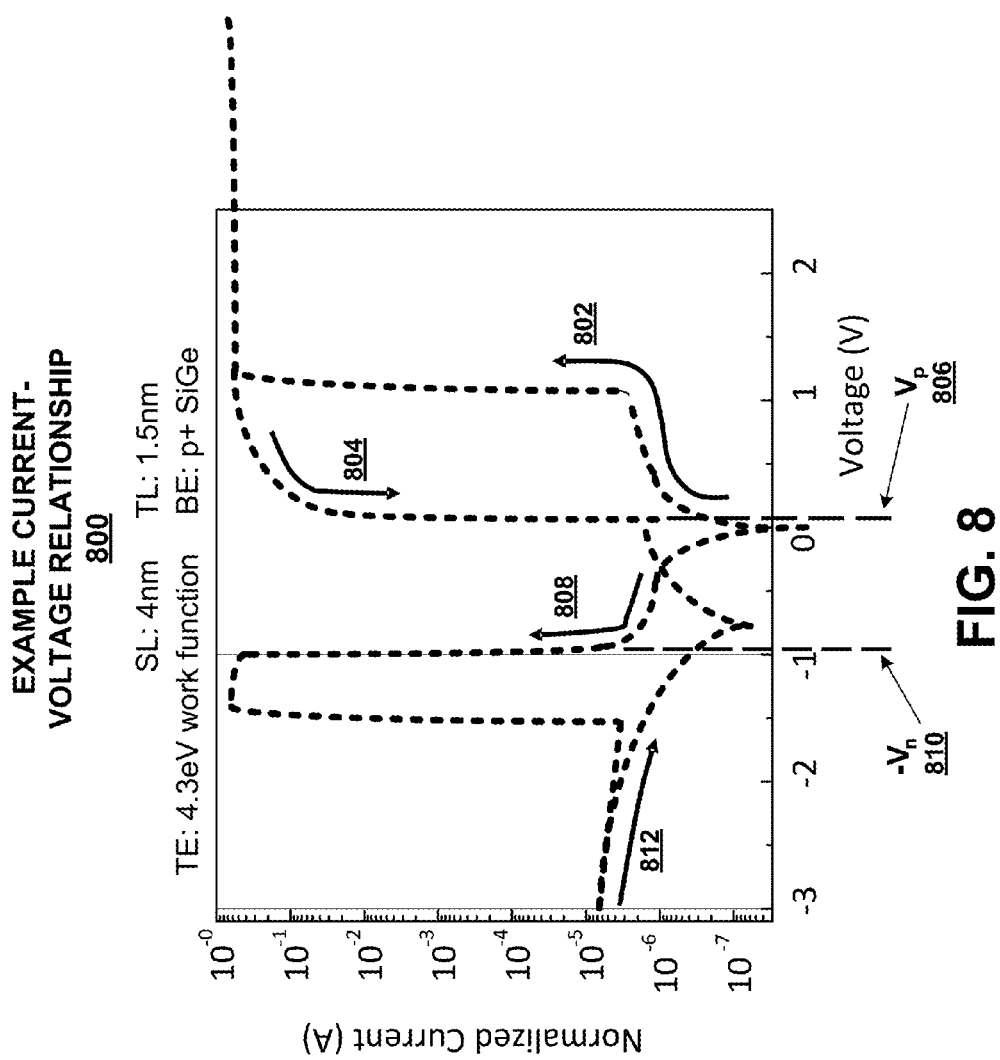
FIG. 8 depicts a current-voltage relationship diagram for an example memory cell having rectifying characteristics, in further embodiments.

FIG. 8 depicts an example diagram 800 of current-voltage relationship for a memory cell having intrinsic rectifying characteristics as described herein. The current-voltage relationship can be an example estimate for a memory cell according to one or more disclosed embodiments. For instance, in one embodiment, the memory cell can have a top electrode with 4.3 eV work function, a bottom electrode of p+ SiGe, an insulating switching material that is about 4 nm thick, and a tunneling layer that is about 1.5 nm thick. A programming signal is applied to the memory cell at 802, increasing current slowly until a significant increase in current results at about one volt. This corresponds with formation of a conductive filament within a switching layer of the memory cell. As voltage is decreased, the increased current follows the path 804 back to about zero amps. Note that the memory cell remains highly resistive for positive voltages up to a positive rectifying voltage $V_p$ 806 of about 0.1 volts. When in the program state, a negative bias below a negative rectifying voltage $-V_n$, of about negative 1 volts has a small current conduction, which helps reduce leakage current. At about negative 1 volts, the large current conduction is observed which corresponds to FIG. 7. At about negative 1.5 volts, the memory cell is erased causing a deformation of the conductive filament.

As seen in FIG. 8, various embodiments of the present invention are "bipolar" devices, where the programming voltage (802) and the erase voltage (808) are of opposite polarity. Such embodiments are believed by the inventors to have an advantage over "unipolar" devices, where programming voltages and erase voltages are of the same polarity. With unipolar devices, conduction (e.g. programming) of a layer occurs at a low voltage, and a disruptive heating process (e.g. erasing) of a layer occurs at a much higher voltage. Some disadvantage to unipolar devices may include that erasing of memories using such joule heating may greatly limit the memory integration with other devices and greatly limit memory density. Additionally, as illustrated in FIG. 8, embodiments of the present invention have a relatively low programming voltage (e.g. 802). In some cases the programming voltage is between about 0.5 volts to about 1.5 volts; between about 0 volts to about 2 volts; between about 0.5 volts to about 5 volts, or the like.

Figure 9:
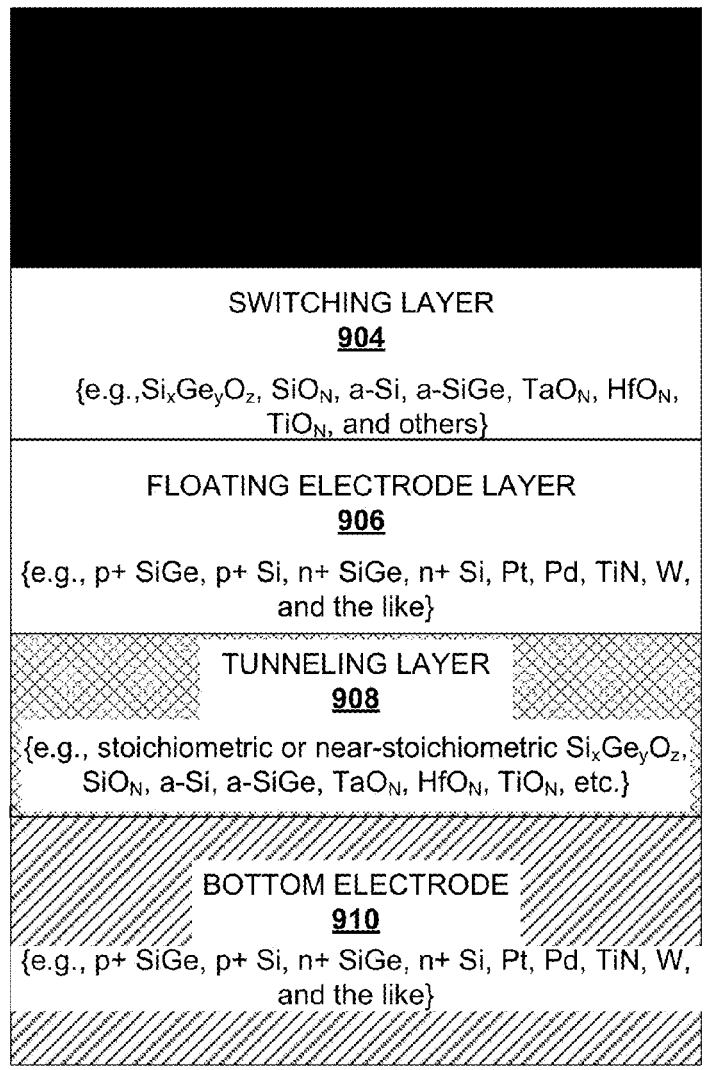
FIG. 9 illustrates a cross-section of an embodiment of the present invention.

FIG. 9 illustrates an example memory cell 900 having a rectifying characteristic(s) according to an alternative embodiment of the subject disclosure. Memory cell 900 can comprise a top electrode 902 and switching layer 904, similar to memory cell 100 or memory cell 200 of FIGS. 1 and 2, supra. Additionally, memory cell 900 can comprise a floating electrode layer 906 between switching layer 904 and a tunneling layer 908. A bottom electrode 910 can be formed adjacent to tunneling layer 908. The combination of top electrode 902, switching layer 904 and floating electrode layer 906 can form a resistive-switching two-terminal memory cell, with floating electrode layer 906 serving as a bottom electrode for the resistive-switching two-terminal memory cell. Additionally, floating electrode layer 906 can serve as a top electrode for a tunnel diode, comprising floating electrode layer 906, tunneling layer 908 and bottom electrode 910. Note that in operation a voltage is not applied directly to floating electrode layer 906, but rather to top electrode 902 and bottom electrode 910, as in the case of memory cell 100 and memory cell 200. While switching layer 904 and tunneling layer 908 are electrically resistive materials (the former being permeable to ions of top electrode 902 and the latter being non-permeable to ions of top electrode 902 and, where suitable non-permeable to ions of floating electrode layer 906), floating electrode layer 906 can be an electrical conductor. In some aspects, floating electrode layer can be formed of similar materials as bottom electrode 910; for instance, p+ SiGe, p+ Si, n+ SiGe, n+ Si, Pt, Pd, TiN, W, and others. Upon formation of a conductive filament within switching layer 904 as described herein, floating electrode layer 906 can conduct current and tunneling layer 908 can still act as a resistor for voltages below a positive or negative rectifying voltage (e.g., for voltages between $-V_n$ and $V_p$). Magnitudes of these rectifying voltages can be affected by thickness and material property (e.g. dielectric constant) of tunneling layer 908 and thickness of switching layer 904, as well as materials utilized for top electrode 902 and bottom electrode 910. In at least some aspects, the magnitudes of these voltages can additionally be affected by material of floating electrode layer 906. Accordingly, floating electrode layer 906 can serve to provide an extra control mechanism over the magnitudes of the positive or negative rectifying voltages, providing an additional or alternative mechanism of control thereof.

In various embodiments of the present invention, after completion of a memory device, as described herein, before functionally performing programming and erase operations, some memory devices need to be conditioned. In particular, in some embodiments, an initial forming voltage may be applied between the top electrode 902 and the bottom electrode 910 to facilitate subsequent formation of TE QD 210, for example. In initial experiments, the initial forming voltages were substantially higher than the programming voltage (e.g. 802). As an example, if a program voltage were about 4 volts, a forming voltage of about 10 volts would be applied to the memory device. A disadvantage to a memory device having such characteristics is that two different types of driving voltage circuits would be required to drive the memory device, one circuit simply for providing the initial forming voltage, and one circuit for providing the programming voltage. In various embodiments, the forming voltage has been greatly reduced, such that the forming voltage may within a range of about the same voltage to about 1 volt higher than the programming voltage. In other embodiments, the forming voltage may be within a range of about the same as the programming voltage to about 2 volts greater than the programming voltage. Advantages to various embodiments include that the forming voltage may be greatly simplified, reduced in circuit area, or folded into the programming voltage circuitry.

The aforementioned diagrams have been described with respect to interaction between several components (e.g., layers) of a memory cell, or memory architectures comprised of such memory cells. It should be appreciated that in some suitable alternative aspects of the subject disclosure, such diagrams can include those components and layers specified therein, some of the specified components/layers, or additional components/layers. Sub-components can also be implemented as electrically connected to other sub-components rather than included within a parent component/layer. Additionally, it is noted that one or more disclosed processes can be combined into a single process providing aggregate functionality. For instance, a program process can comprise a read process, or vice versa, to facilitate programming and reading a semiconductor cell by way of a single process. In addition, it should be appreciated that respective rows of disclosed memory architectures can be erased in groups (e.g., multiple rows erased concurrently) or individually. Moreover, it should be appreciated that multiple disclosed memory cells arranged on a particular row can be programmed in groups (e.g., multiple memory cells programmed concurrently) or individually. Components of the disclosed architectures can also interact with one or more other components not specifically described herein but known by those of skill in the art.

Figure 10:
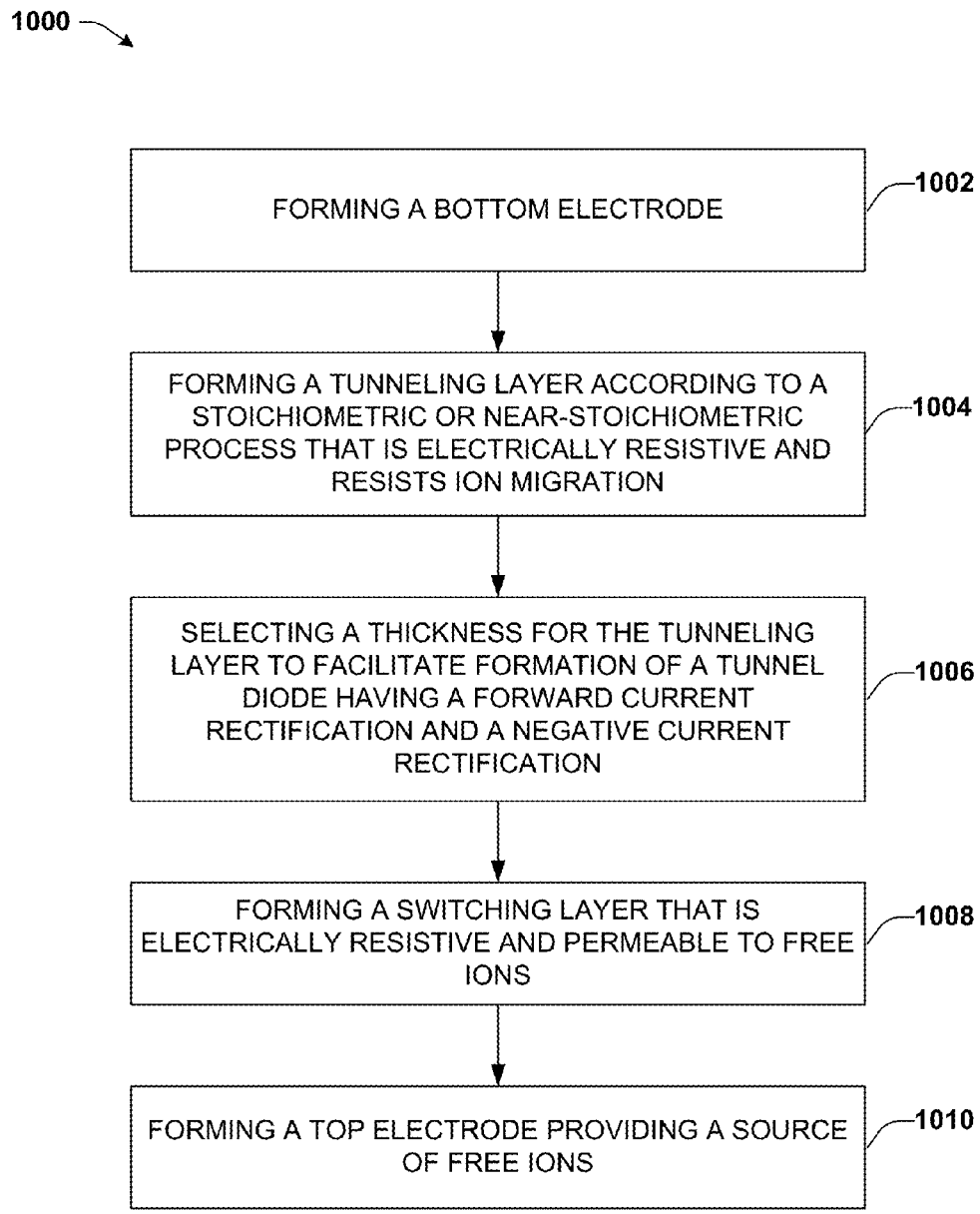
FIG. 10 illustrates a flowchart of an example method for fabricating a two-terminal memory cell having rectifying characteristics, in an embodiment(s).

In view of the exemplary diagrams described supra, process methods that can be implemented in accordance with the disclosed subject matter will be better appreciated with reference to the flow chart of FIG. 10. While for purposes of simplicity of explanation, the method of FIG. 10 is shown and described as a series of blocks, it is to be understood and appreciated that the claimed subject matter is not limited by the order of the blocks, as some blocks may occur in different orders or concurrently with other blocks from what is depicted and described herein. Moreover, not all illustrated blocks are necessarily required to implement the methods described herein. Additionally, it should be further appreciated that the methods disclosed throughout this specification are capable of being stored on an article of manufacture to facilitate transporting and transferring such methodologies to an electronic device. The term article of manufacture, as used, is intended to encompass a computer program accessible from any computer-readable device, device in conjunction with a carrier, or storage medium.

FIG. 10 depicts a flowchart of an example method 1000 of fabricating a memory cell having a rectifying characteristic (s) according to one or more additional embodiments of the subject disclosure. At 1002, method 1000 can comprise forming a bottom electrode of a memory cell. The bottom electrode can be formed of a suitable electrical conductor, including a metal or a doped semiconductor material. At 1004, method 1000 can comprise forming a tunneling layer according to a substantially stoichiometric process that is electrically resistive and resists migration of free ions into the tunneling layer. Although not depicted, method 1000 can optionally comprise forming a floating electrode layer adjacent to the tunneling layer (e.g., see FIG. 9, supra). In addition, at 1006, method 1000 can comprise selecting a thickness for the tunneling layer to facilitate formation of a tunnel diode having a forward current rectification and a negative current rectification. At 1008, method 1000 can comprise forming a switching layer adjacent to the tunneling layer (or optionally adjacent to the floating electrode layer) that is electrically resistive but is permeable to free ions within the switching layer. At 1010, method 1000 can comprise forming a top electrode providing a source of the free ions. In a particular embodiment, selecting the thickness for the tunneling layer can further comprise selecting a thickness between about 0.5 nm and about 5 nm. In yet another embodiment, method 1000 can comprise forming the tunneling layer to have a first thickness and forming the switching layer to have a second thickness that is greater than the first thickness. As one example embodiment, the second thickness can be between about 1 nm and about 20 nm and can be about 2 to about 3 times larger than the first thickness.

Figure 11:
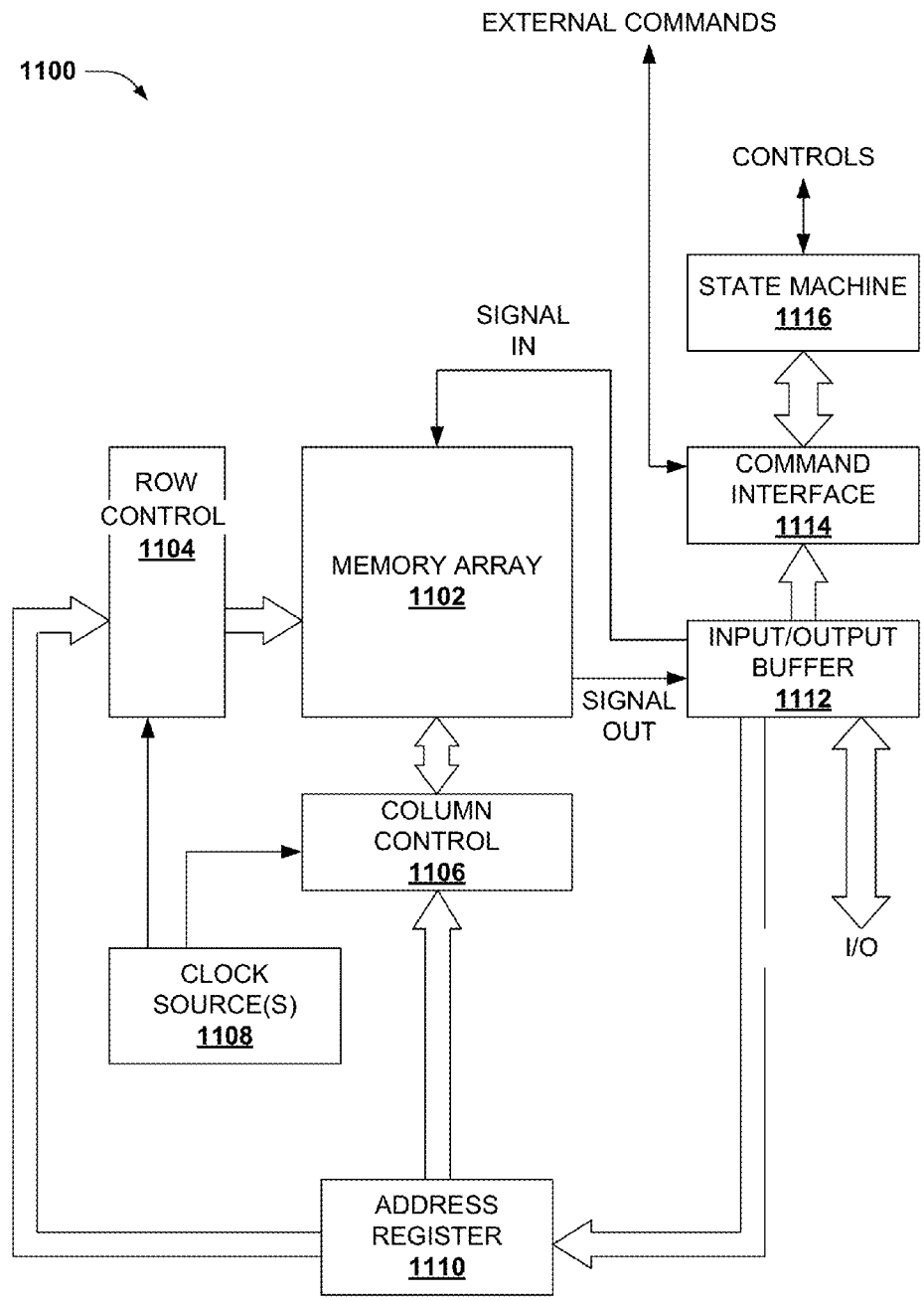
FIG. 11 depicts a block diagram of a sample operating environment for facilitating implementation of one or more disclosed embodiments.

In order to provide a context for the various aspects of the disclosed subject matter, FIG. 11, as well as the following discussion, is intended to provide a brief, general description of a suitable environment in which various aspects of the disclosed subject matter can be implemented or processed. While the subject matter has been described above in the general context of semiconductor architectures and process methodologies for fabricating and operating such architectures, those skilled in the art will recognize that the subject disclosure also can be implemented in combination with other architectures or process methodologies. Moreover, those skilled in the art will appreciate that the disclosed processes can be practiced with a processing system or a computer processor, either alone or in conjunction with a host computer (e.g., computer 1202 of FIG. 12, infra), which can include single-processor or multiprocessor computer systems, mini-computing devices, mainframe computers, as well as personal computers, hand-held computing devices (e.g., PDA, smart phone, watch), microprocessor-based or programmable consumer or industrial electronics, and the like. The illustrated aspects may also be practiced in distributed computing environments where tasks are performed by remote processing devices that are linked through a communications network. However, some, if not all aspects of the claimed innovation can be practiced on stand-alone electronic devices, such as a memory card, Flash memory module, removable memory, or the like. In a distributed computing environment, program modules can be located in both local and remote memory storage modules or devices.

FIG. 11 illustrates a block diagram of an example operating and control environment 1100 for a memory cell array 1102 according to aspects of the subject disclosure. In at least one aspect of the subject disclosure, memory cell array 1102 can comprise a variety of memory cell memory cell technology. Particularly, memory cell array can comprise resistive switching memory cells having rectifier characteristics, as described herein.

A column controller 1106 can be formed adjacent to memory cell array 1102. Moreover, column controller 1106 can be electrically coupled with bit lines of memory cell array 1102. Column controller 1106 can control respective bitlines, applying suitable program, erase or read voltages to selected bitlines.

In addition, operating and control environment 1100 can comprise a row controller 1104. Row controller 1104 can be formed adjacent to column controller 1106, and electrically connected with word lines of memory cell array 1102. Row controller 1104 can select particular rows of memory cells with a suitable selection voltage. Moreover, row controller 1104 can facilitate program, erase or read operations by applying suitable voltages at selected word lines.

A clock source(s) 1108 can provide respective clock pulses to facilitate timing for read, write, and program operations of row control 1104 and column control 1106. Clock source(s) 1108 can further facilitate selection of word lines or bit lines in response to external or internal commands received by operating and control environment 1100. An input/output buffer 1112 can be connected to an external host apparatus, such as a computer or other processing device (not depicted, but see e.g., computer 1202 of FIG. 12, infra) by way of an I/O buffer or other I/O communication interface. Input/output buffer 1112 can be configured to receive write data, receive an erase instruction, output readout data, and receive address data and command data, as well as address data for respective instructions. Address data can be transferred to row controller 1104 and column controller 1106 by an address register 1110. In addition, input data is transmitted to memory cell array 1102 via signal input lines, and output data is received from memory cell array 1102 via signal output lines. Input data can be received from the host apparatus, and output data can be delivered to the host apparatus via the I/O buffer.

Commands received from the host apparatus can be provided to a command interface 1114. Command interface 1114 can be configured to receive external control signals from the host apparatus, and determine whether data input to the input/output buffer 1112 is write data, a command, or an address. Input commands can be transferred to a state machine 1116.

State machine 1116 can be configured to manage programming and reprogramming of memory cell array 1102. State machine 1116 receives commands from the host apparatus via input/output interface 1112 and command interface 1114, and manages read, write, erase, data input, data output, and like functionality associated with memory cell array 1102. In some aspects, state machine 1116 can send and receive acknowledgments and negative acknowledgments regarding successful receipt or execution of various commands.

To implement read, write, erase, input, output, etc., functionality, state machine 1116 can control clock source(s) 1108. Control of clock source(s) 1108 can cause output pulses configured to facilitate row controller 1104 and column controller 1106 implementing the particular functionality. Output pulses can be transferred to selected bit lines by column controller 1106, for instance, or word lines by row controller 1104, for instance.

In connection with FIG. 12, the systems and processes described below can be embodied within hardware, such as a single integrated circuit (IC) chip, multiple ICs, an application specific integrated circuit (ASIC), or the like. Further, the order in which some or all of the process blocks appear in each process should not be deemed limiting. Rather, it should be understood that some of the process blocks can be executed in a variety of orders, not all of which may be explicitly illustrated herein.

Figure 12:
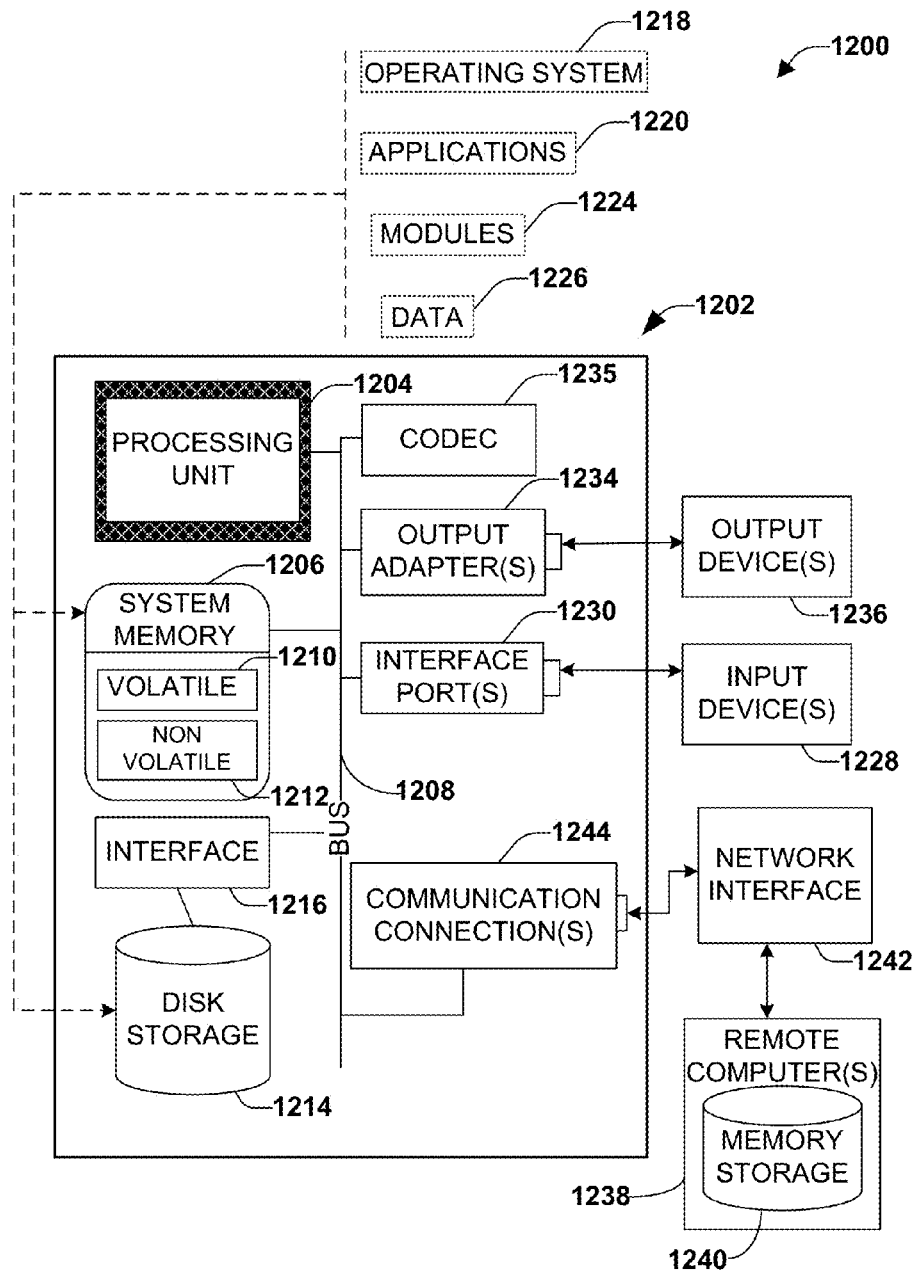
FIG. 12 illustrates a block diagram of an example computing environment that can be implemented in conjunction with various embodiments.

With reference to FIG. 12, a suitable environment 1200 for implementing various aspects of the claimed subject matter includes a computer 1202. The computer 1202 includes a processing unit 1204, a system memory 1206, a codec 1235, and a system bus 1208. The system bus 1208 couples system components including, but not limited to, the system memory 1206 to the processing unit 1204. The processing unit 1204 can be any of various available processors. Dual microprocessors and other multiprocessor architectures also can be employed as the processing unit 1204.

The system bus 1208 can be any of several types of bus structure(s) including the memory bus or memory controller, a peripheral bus or external bus, and/or a local bus using any variety of available bus architectures including, but not limited to, Industrial Standard Architecture (ISA), Micro-Channel Architecture (MSA), Extended ISA (EISA), Intelligent Drive Electronics (IDE), VESA Local Bus (VLB), Peripheral Component Interconnect (PCI), Card Bus, Universal Serial Bus (USB), Advanced Graphics Port (AGP), Personal Computer Memory Card International Association bus (PCMCIA), Firewire (IEEE 1394), and Small Computer Systems Interface (SCSI).

The system memory 1206 includes volatile memory 1210 and non-volatile memory 1212, which can employ one or more of the disclosed memory architectures, in various embodiments. The basic input/output system (BIOS), containing the basic routines to transfer information between elements within the computer 1202, such as during start-up, is stored in non-volatile memory 1212. In addition, according to the present disclosure, codec 1235 may include at least one of an encoder or decoder, wherein the at least one of an encoder or decoder may consist of hardware, software, or a combination of hardware and software. Although, codec 1235 is depicted as a separate component, codec 1235 may be contained within non-volatile memory 1212. By way of illustration, and not limitation, non-volatile memory 1212 can include read only memory (ROM), programmable ROM (PROM), electrically programmable ROM (EPROM), electrically erasable programmable ROM (EEPROM), or Flash memory. Non-volatile memory 1212 can employ one or more of the disclosed memory architectures, in at least some disclosed embodiments. Moreover, non-volatile memory 1212 can be computer memory (e.g., physically integrated with computer 1202 or a mainboard thereof), or removable memory. Examples of suitable removable memory with which disclosed embodiments can be implemented can include a secure digital (SD) card, a compact Flash (CF) card, a universal serial bus (USB) memory stick, or the like. Volatile memory 1210 includes cache memory, or random access memory (RAM), which acts as external cache memory, and can also employ one or more disclosed memory architectures in various embodiments. By way of illustration and not limitation, RAM is available in many forms such as static RAM (SRAM), dynamic RAM (DRAM), synchronous DRAM (SDRAM), double data rate SDRAM (DDR SDRAM), and enhanced SDRAM (ESDRAM), and so forth.

Computer 1202 may also include removable/non-removable, volatile/non-volatile computer storage medium. FIG. 12 illustrates, for example, disk storage 1214. Disk storage 1214 includes, but is not limited to, devices like a magnetic disk drive, solid state disk (SSD) floppy disk drive, tape drive, Jaz drive, Zip drive, LS-100 drive, flash memory card, or memory stick. In addition, disk storage 1214 can include storage medium separately or in combination with other storage medium including, but not limited to, an optical disk drive such as a compact disk ROM device (CD-ROM), CD recordable drive (CD-R Drive), CD rewritable drive (CD-RW Drive) or a digital versatile disk ROM drive (DVD-ROM). To facilitate connection of the disk storage devices 1214 to the system bus 1208, a removable or non-removable interface is typically used, such as interface 1216. It is appreciated that storage devices 1214 can store information related to a user. Such information might be stored at or provided to a server or to an application running on a user device. In one embodiment, the user can be notified (e.g., by way of output device(s) 1236) of the types of information that are stored to disk storage 1214 and/or transmitted to the server or application.

The user can be provided the opportunity to opt-in or opt-out of having such information collected and/or shared with the server or application (e.g., by way of input from input device(s) 1228).

It is to be appreciated that FIG. 12 describes software that acts as an intermediary between users and the basic computer resources described in the suitable operating environment 1200. Such software includes an operating system 1218. Operating system 1218, which can be stored on disk storage 1214, acts to control and allocate resources of the computer system 1202. Applications 1220 take advantage of the management of resources by operating system 1218 through program modules 1224, and program data 1226, such as the boot/shutdown transaction table and the like, stored either in system memory 1206 or on disk storage 1214. It is to be appreciated that the claimed subject matter can be implemented with various operating systems or combinations of operating systems.

A user enters commands or information into the computer 1202 through input device(s) 1228. Input devices 1228 include, but are not limited to, a pointing device such as a mouse, trackball, stylus, touch pad, keyboard, microphone, joystick, game pad, satellite dish, scanner, TV tuner card, digital camera, digital video camera, web camera, and the like. These and other input devices connect to the processing unit 1204 through the system bus 1208 via interface port(s) 1230. Interface port(s) 1230 include, for example, a serial port, a parallel port, a game port, and a universal serial bus (USB). Output device(s) 1236 use some of the same type of ports as input device(s) 1228. Thus, for example, a USB port may be used to provide input to computer 1202 and to output information from computer 1202 to an output device 1236. Output adapter 1234 is provided to illustrate that there are some output devices 1236 like monitors, speakers, and printers, among other output devices 1236, which require special adapters. The output adapters 1234 include, by way of illustration and not limitation, video and sound cards that provide a means of connection between the output device 1236 and the system bus 1208. It should be noted that other devices and/or systems of devices provide both input and output capabilities such as remote computer(s) 1238.

Computer 1202 can operate in a networked environment using logical connections to one or more remote computers, such as remote computer(s) 1238. The remote computer(s) 1238 can be a personal computer, a server, a router, a network PC, a workstation, a microprocessor based appliance, a peer device, a smart phone, a tablet, or other network node, and typically includes many of the elements described relative to computer 1202. For purposes of brevity, only a memory storage device 1240 is illustrated with remote computer(s) 1238. Remote computer(s) 1238 is logically connected to computer 1202 through a network interface 1242 and then connected via communication connection(s) 1244. Network interface 1242 encompasses wire and/or wireless communication networks such as local-area networks (LAN) and wide-area networks (WAN) and cellular networks. LAN technologies include Fiber Distributed Data Interface (FDDI), Copper Distributed Data Interface (CDDI), Ethernet, Token Ring and the like. WAN technologies include, but are not limited to, point-to-point links, circuit switching networks like Integrated Services Digital Networks (ISDN) and variations thereon, packet switching networks, and Digital Subscriber Lines (DSL).

Communication connection(s) 1244 refers to the hardware/software employed to connect the network interface 1242 to the bus 1208. While communication connection 1244 is shown for illustrative clarity inside computer 1202, it can also be external to computer 1202. The hardware/software necessary for connection to the network interface 1242 includes, for exemplary purposes only, internal and external technologies such as, modems including regular telephone grade modems, cable modems and DSL modems, ISDN adapters, and wired and wireless Ethernet cards, hubs, and routers.

The illustrated aspects of the disclosure may also be practiced in distributed computing environments where certain tasks are performed by remote processing devices that are linked through a communications network. In a distributed computing environment, program modules or stored information, instructions, or the like can be located in local or remote memory storage devices.

Moreover, it is to be appreciated that various components described herein can include electrical circuit(s) that can include components and circuitry elements of suitable value in order to implement the embodiments of the subject disclosure. Furthermore, it can be appreciated that many of the various components can be implemented on one or more IC chips. For example, in one embodiment, a set of components can be implemented in a single IC chip. In other embodiments, one or more of respective components are fabricated or implemented on separate IC chips.

As utilized herein, terms "component," "system," "architecture" and the like are intended to refer to a computer or electronic-related entity, either hardware, a combination of hardware and software, software (e.g., in execution), or firmware. For example, a component can be one or more transistors, a memory cell, an arrangement of transistors or memory cells, a gate array, a programmable gate array, an application specific integrated circuit, a controller, a processor, a process running on the processor, an object, executable, program or application accessing or interfacing with semiconductor memory, a computer, or the like, or a suitable combination thereof. The component can include erasable programming (e.g., process instructions at least in part stored in erasable memory) or hard programming (e.g., process instructions burned into non-erasable memory at manufacture).

By way of illustration, both a process executed from memory and the processor can be a component. As another example, an architecture can include an arrangement of electronic hardware (e.g., parallel or serial transistors), processing instructions and a processor, which implement the processing instructions in a manner suitable to the arrangement of electronic hardware. In addition, an architecture can include a single component (e.g., a transistor, a gate array, . . . ) or an arrangement of components (e.g., a series or parallel arrangement of transistors, a gate array connected with program circuitry, power leads, electrical ground, input signal lines and output signal lines, and so on). A system can include one or more components as well as one or more architectures. One example system can include a switching block architecture comprising crossed input/output lines and pass gate transistors, as well as power source(s), signal generator(s), communication bus(ses), controllers, I/O interface, address registers, and so on. It is to be appreciated that some overlap in definitions is anticipated, and an architecture or a system can be a stand-alone component, or a component of another architecture, system, etc.

In addition to the foregoing, the disclosed subject matter can be implemented as a method, apparatus, or article of manufacture using typical manufacturing, programming or engineering techniques to produce hardware, firmware, software, or any suitable combination thereof to control an electronic device to implement the disclosed subject matter. The terms "apparatus" and "article of manufacture" where used herein are intended to encompass an electronic device, a semiconductor device, a computer, or a computer program accessible from any computer-readable device, carrier, or media. Computer-readable media can include hardware media, or software media. In addition, the media can include non-transitory media, or transport media. In one example, non-transitory media can include computer readable hardware media. Specific examples of computer readable hardware media can include but are not limited to magnetic storage devices (e.g., hard disk, floppy disk, magnetic strips . . . ), optical disks (e.g., compact disk (CD), digital versatile disk (DVD) . . . ), smart cards, and flash memory devices (e.g., card, stick, key drive . . . ). Computer-readable transport media can include carrier waves, or the like. Of course, those skilled in the art will recognize many modifications can be made to this configuration without departing from the scope or spirit of the disclosed subject matter.

What has been described above includes examples of the subject innovation. It is, of course, not possible to describe every conceivable combination of components or methodologies for purposes of describing the subject innovation, but one of ordinary skill in the art can recognize that many further combinations and permutations of the subject innovation are possible. Accordingly, the disclosed subject matter is intended to embrace all such alterations, modifications and variations that fall within the spirit and scope of the disclosure. Furthermore, to the extent that a term "includes", "including", "has" or "having" and variants thereof is used in either the detailed description or the claims, such term is intended to be inclusive in a manner similar to the term "comprising" as "comprising" is interpreted when employed as a transitional word in a claim.

Moreover, the word "exemplary" is used herein to mean serving as an example, instance, or illustration. Any aspect or design described herein as "exemplary" is not necessarily to be construed as preferred or advantageous over other aspects or designs. Rather, use of the word exemplary is intended to present concepts in a concrete fashion. As used in this application, the term "or" is intended to mean an inclusive "or" rather than an exclusive "or". That is, unless specified otherwise, or clear from context, "X employs A or B" is intended to mean any of the natural inclusive permutations. That is, if X employs A; X employs B; or X employs both A and B, then "X employs A or B" is satisfied under any of the foregoing instances. In addition, the articles "a" and "an" as used in this application and the appended claims should generally be construed to mean "one or more" unless specified otherwise or clear from context to be directed to a singular form.

Additionally, some portions of the detailed description have been presented in terms of algorithms or process operations on data bits within electronic memory. These process descriptions or representations are mechanisms employed by those cognizant in the art to effectively convey the substance of their work to others equally skilled. A process is here, generally, conceived to be a self-consistent sequence of acts leading to a desired result. The acts are those requiring physical manipulations of physical quantities. Typically, though not necessarily, these quantities take the form of electrical and/or magnetic signals capable of being stored, transferred, combined, compared, and/or otherwise manipulated.

It has proven convenient, principally for reasons of common usage, to refer to these signals as bits, values, elements, symbols, characters, terms, numbers, or the like. It should be borne in mind, however, that all of these and similar terms are to be associated with the appropriate physical quantities and are merely convenient labels applied to these quantities. Unless specifically stated otherwise or apparent from the foregoing discussion, it is appreciated that throughout the disclosed subject matter, discussions utilizing terms such as processing, computing, replicating, mimicking, determining, or transmitting, and the like, refer to the action and processes of processing systems, and/or similar consumer or industrial electronic devices or machines, that manipulate or transform data or signals represented as physical (electrical or electronic) quantities within the circuits, registers or memories of the electronic device(s), into other data or signals similarly represented as physical quantities within the machine or computer system memories or registers or other such information storage, transmission and/or display devices.

In regard to the various functions performed by the above described components, architectures, circuits, processes and the like, the terms (including a reference to a "means") used to describe such components are intended to correspond, unless otherwise indicated, to any component which performs the specified function of the described component (e.g., a functional equivalent), even though not structurally equivalent to the disclosed structure, which performs the function in the herein illustrated exemplary aspects of the embodiments. In addition, while a particular feature may have been disclosed with respect to only one of several implementations, such feature may be combined with one or more other features of the other implementations as may be desired and advantageous for any given or particular application. It will also be recognized that the embodiments include a system as well as a computer-readable medium having computer-executable instructions for performing the acts and/or events of the various processes.

What is claimed is:

1. A memory cell, comprising:
   a bottom electrode;
   a top electrode comprising a material that is electrically conductive and configured to provide ions of the material under applied bias;
   a switching layer comprising a second material, and that is formed as a non-stoichiometric amorphous structure that is electrically resistive and at least in part permeable to the ions of the material of the top electrode, wherein a subset of the ions migrate into the switching layer in response to application of a program voltage to the memory cell and form a conductive filament through at least a portion of the switching layer; and
   a tunneling layer positioned between the switching layer and the bottom electrode that is electrically resistive and less permeable to the ions of the material of the top electrode relative to the switching layer, wherein the tunneling layer facilitates a tunneling current between the conductive filament and the bottom electrode.

2. The memory cell of claim 1, wherein a thickness of the tunneling layer is selected to provide a tunneling distance between the conductive filament and the bottom electrode, and further wherein a magnitude of the tunneling distance is a function at least of the program voltage.

3. The memory cell of claim 1, wherein the conducting filament, the tunneling layer and the bottom electrode form a tunnel diode that provides a rectifying resistance for the memory cell.

4. The memory cell of claim 3, wherein the rectifying resistance mitigates current in response to a positive bias of a magnitude less than a positive read bias associated with the memory cell, and in response to a negative bias of a magnitude less than an erase bias associated with the memory cell.

5. The memory cell of claim 1, wherein the tunneling layer is formed of the second material.

6. The memory cell of claim 5, wherein the second material comprises an amorphous silicon, an amorphous silicon-germanium, a semiconductor sub-oxide, a metal oxide or a metal sub-oxide.

7. The memory cell of claim 1, the tunneling layer is formed of a stoichiometric or a near stoichiometric composition that resists migration of the ions into the tunneling layer.

8. The memory cell of claim 7, wherein the stoichiometric or near stoichiometric composition includes a poly-crystalline structure and is selected from a group consisting of: poly Si, poly SiGe, TiOx, TaOx, and CuOx.

9. The memory cell of claim 1, further comprising a floating electrode layer positioned between the switching layer and the tunneling layer, the floating electrode layer comprising a conductive material having no direct electrical connection to a power source.

10. The memory cell of claim 1, wherein the switching layer has a thickness between about 1 nanometer (nm) and about 20 nm and further wherein the tunneling layer has a thickness between about 0.5 nm and about 5 nm thick.

11. The memory cell of claim 1, wherein a first thickness of the tunneling layer is between about one half and about one quarter of a second thickness of the switching layer.

12. The memory cell of claim 1, wherein the conductive filament is at least in part deformed in response to an erase voltage applied to the memory cell, the erase voltage having a magnitude within an operational range of the memory cell.

13. The memory cell of claim 12, wherein the magnitude is between about one volt and about five volts.

14. The memory cell of claim 1, wherein the top electrode is formed of a material selected from a group consisting of: aluminum, silver, copper, platinum, palladium, and tungsten.

15. The memory cell of claim 1, wherein the bottom electrode is formed of a p type silicon-germanium, a p type silicon, an n type silicon-germanium, an n type silicon, platinum, palladium, titanium-nitride, tungsten, copper or aluminum.

16. A method of fabricating a memory cell, comprising:
forming a bottom electrode;
forming a tunneling layer according to a stoichiometric or near stoichiometric process and comprising an amorphous silicon, an amorphous silicon-germanium, a semiconductor sub-oxide, a metal oxide or a metal sub-oxide, that is electrically resistive and resists migration of at least some ions related to the memory cell into the tunneling layer;
forming a switching layer that is electrically resistive according to a non-stoichiometric and amorphous process that facilitates permeability of the ions within the switching layer; and
forming a top electrode providing a source of the ions in response to application of a program bias; wherein forming the tunneling layer further comprises selecting a thickness for the tunneling layer configured to facilitate a tunneling current between at least the bottom electrode and a conductive filament of the ions formed within the switching layer in response to a program voltage applied to the memory cell.

17. The method of claim 16, further comprising forming the tunneling layer to have a thickness between about 0.5 nanometers (nm) and about 5 nm thick.

18. The method of claim 16, further comprising forming the tunneling layer to have a first thickness and forming the switching layer to have a second thickness, wherein the second thickness is between about 1 nm and about 20 nm, and is between about 2 to about 3 times larger than the first thickness.

19. An electronic device, comprising:
a memory configured to store instructions for operating the electronic device and comprising at least one memory cell;
a memory controller configured to operate the memory; and
a processor communicatively connected to the memory and configured to execute the instructions, the memory cell comprising:
a bottom electrode, a tunneling layer, a switching layer and a top electrode, the memory controller configured to program the at least one memory cell via a program bias and to erase the at least one memory cell via an erase bias, the at least one memory cell configured to form a high resistance state in response to the erase bias and configured to form a low resistance state in response to the program bias, and configured to have a rectifying resistance in the low resistance state to voltages between $-V_n$ and $V_p$, wherein the tunneling layer is formed of a first material via a stoichiometric or near-stoichiometric process and the switching layer is formed of the first material via a non-stoichiometric and amorphous process.

20. The electronic device of claim 19, wherein the switching layer is between about 1 nanometer (nm) and about 20 nm, and wherein the tunneling layer is between about 0.5 nm and about 5 nm, and wherein the switching layer is at least in part permeable to ions provided by the top electrode and form a conductive filament within the switching layer in response to the program bias, and wherein the tunneling layer has lower permeability to the ions relative the switching layer and forms a non-conductive gap between the conductive filament and the bottom electrode, wherein the conductive filament, the tunneling layer and the bottom electrode form a tunnel diode having the rectifying resistance, and wherein $-V_n$ has a larger magnitude than $V_p$.

* * * * *